United States Patent
Cozzi et al.

(10) Patent No.: US 12,312,274 B2
(45) Date of Patent: *May 27, 2025

(54) VISUAL COMMUNICATIONS

(71) Applicant: Sococo, Inc., Austin, TX (US)

(72) Inventors: Eric Cozzi, Hayward, CA (US); David Van Wie, Eugene, OR (US); Paul J. Brody, Palo Alto, CA (US); Matthew Leacock, Sunnyvale, CA (US)

(73) Assignee: Sococo, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/336,795

(22) Filed: Jun. 16, 2023

(65) Prior Publication Data
US 2023/0344878 A1   Oct. 26, 2023

Related U.S. Application Data

(63) Continuation of application No. 17/242,605, filed on Apr. 28, 2021, now Pat. No. 11,785,056, which is a
(Continued)

(51) Int. Cl.
| | |
|---|---|
| *H04L 65/1069* | (2022.01) |
| *C04B 35/03* | (2006.01) |
| *C04B 35/119* | (2006.01) |
| *C04B 37/02* | (2006.01) |
| *H01L 23/15* | (2006.01) |
| *H04L 65/1104* | (2022.01) |

(Continued)

(52) U.S. Cl.
CPC ............ *C04B 35/119* (2013.01); *C04B 35/03* (2013.01); *C04B 37/021* (2013.01); *C04B 37/025* (2013.01); *H01L 23/15* (2013.01); *H04L 65/1069* (2013.01); *H04L 65/1104* (2022.05); *H04L 65/65* (2022.05); *H04L 67/131* (2022.05); *H04L 67/52* (2022.05); *H04L 67/54* (2022.05); *H04W 4/021* (2013.01); *C04B 2235/3222* (2013.01); *C04B 2235/5436* (2013.01)

(58) Field of Classification Search
CPC . H04L 65/1069; H04L 65/1104; H04L 67/54; H04L 67/131; H04L 67/52; H04L 65/65; H04W 4/021; C04B 35/119; C04B 35/03; C04B 37/021; C04B 37/025
USPC ......................................................... 370/352
See application file for complete search history.

(56) References Cited

U.S. PATENT DOCUMENTS

| | | | |
|---|---|---|---|
| 6,559,863 B1 * | 5/2003 | Megiddo | .................. H04N 7/15 348/E7.083 |
| 2005/0022139 A1 * | 1/2005 | Gettman | ............... G06F 16/954 715/811 |

(Continued)

OTHER PUBLICATIONS

Notice of Allowance mailed Jan. 28, 2021, filed in U.S. Appl. No. 16/120,026, pp. 1-3.
(Continued)

*Primary Examiner* — Faisal Choudhury

(57) ABSTRACT

A persistent virtual area that supports establishment of respective presences of communicants operating respective network nodes connected to the virtual area even after all network nodes have disconnected from the virtual area is maintained. A presence in the virtual area is established for
(Continued)

a user of a Public Switched Telephone Network (PSTN) terminal device. Transmission of data associated with the virtual area to the PSTN terminal device.

17 Claims, 14 Drawing Sheets

Related U.S. Application Data continuation of application No. 16/120,026, filed on Aug. 31, 2018, now Pat. No. 11,025,679, which is a continuation of application No. 15/168,481, filed on May 31, 2016, now Pat. No. 10,069,873, which is a continuation of application No. 13/165,729, filed on Jun. 21, 2011, now Pat. No. 9,357,025, which is a continuation-in-part of application No. 12/694,126, filed on Jan. 26, 2010, now Pat. No. 9,009,603.

(51) Int. Cl.
*H04L 65/65* (2022.01)
*H04L 67/131* (2022.01)
*H04L 67/52* (2022.01)
*H04L 67/54* (2022.01)
*H04W 4/021* (2018.01)

(56) References Cited

U.S. PATENT DOCUMENTS

2009/0150802 A1* 6/2009 Do .................. G06F 3/011
 715/757
2009/0240803 A1* 9/2009 Iwakawa ............. H04L 65/1069
 714/E11.002
2009/0271714 A1* 10/2009 Cox ...................... A63F 13/795
 715/753

OTHER PUBLICATIONS

Request for Continued Examination dated Jan. 15, 2021, filed in U.S. Appl. No. 16/120,026, pp. 1-3.
Notice of Allowance mailed Oct. 15, 2020, filed in U.S. Appl. No. 16/120,026, pp. 1-4.
Response to Final Office Action dated Oct. 1, 2020, filed in U.S. Appl. No. 16/120,026, pp. 1-8.
Final Office Action mailed May 1, 2020, filed in U.S. Appl. No. 16/120,026, pp. 1-5.
Response to Non-Final Office Action dated Apr. 9, 2020, filed in U.S. Appl. No. 16/120,026, pp. 1-9.
Non-Final Office Action mailed Dec. 9, 2019, filed in U.S. Appl. No. 16/120,026, pp. 1-7.

* cited by examiner

VISUAL COMMUNICATIONS

CROSS-REFERENCE TO RELATED APPLICATIONS

This application is a continuation of U.S. patent application Ser. No. 17/242,605, filed Apr. 28, 2021, which is a continuation of U.S. patent application Ser. No. 15/168,481, filed May 31, 2016, which is a continuation of U.S. patent application Ser. No. 13/165,729, filed Jun. 21, 2011, which is a continuation-in-part of U.S. patent application Ser. No. 12/694,126, filed Jan. 26, 2010, the entirety of each which is incorporated herein by reference.

This application also relates to the following co-pending patent applications, the entirety of each of which is incorporated herein by reference: U.S. Provisional Patent Application No. 61/449,059, filed Mar. 3, 2011; U.S. Provisional Patent Application No. 61/373,914, filed Aug. 16, 2010; U.S. patent application Ser. No. 12/825,512, filed Jun. 29, 2010; U.S. patent application Ser. No. 12/509,658, filed Jul. 27, 2009; U.S. patent application Ser. No. 12/418,270, filed Apr. 3, 2009; U.S. patent application Ser. No. 12/354,709, filed Jan. 15, 2009; U.S. application Ser. No. 12/630,973, filed on Dec. 4, 2009; U.S. patent application Ser. No. 11/923,629, filed Oct. 24, 2007; and U.S. patent application Ser. No. 11/923,634, filed Oct. 24, 2007.

BACKGROUND

When face-to-face communications are not practical, people often rely on one or more technological solutions to meet their communications needs. These solutions typically are designed to simulate one or more aspects of face-to-face communications. Traditional telephony systems enable voice communications between callers. Instant messaging (also referred to as "chat") communications systems enable users to communicate text messages in real time through instant message computer clients. Some instant messaging systems additionally allow users to be represented in a virtual environment by user-controllable graphical objects (referred to as "avatars"). Interactive virtual reality communication systems enable users in remote locations to communicate and interact with each other by manipulating their respective avatars in virtual spaces.

DETAILED DESCRIPTION

Figure 1:
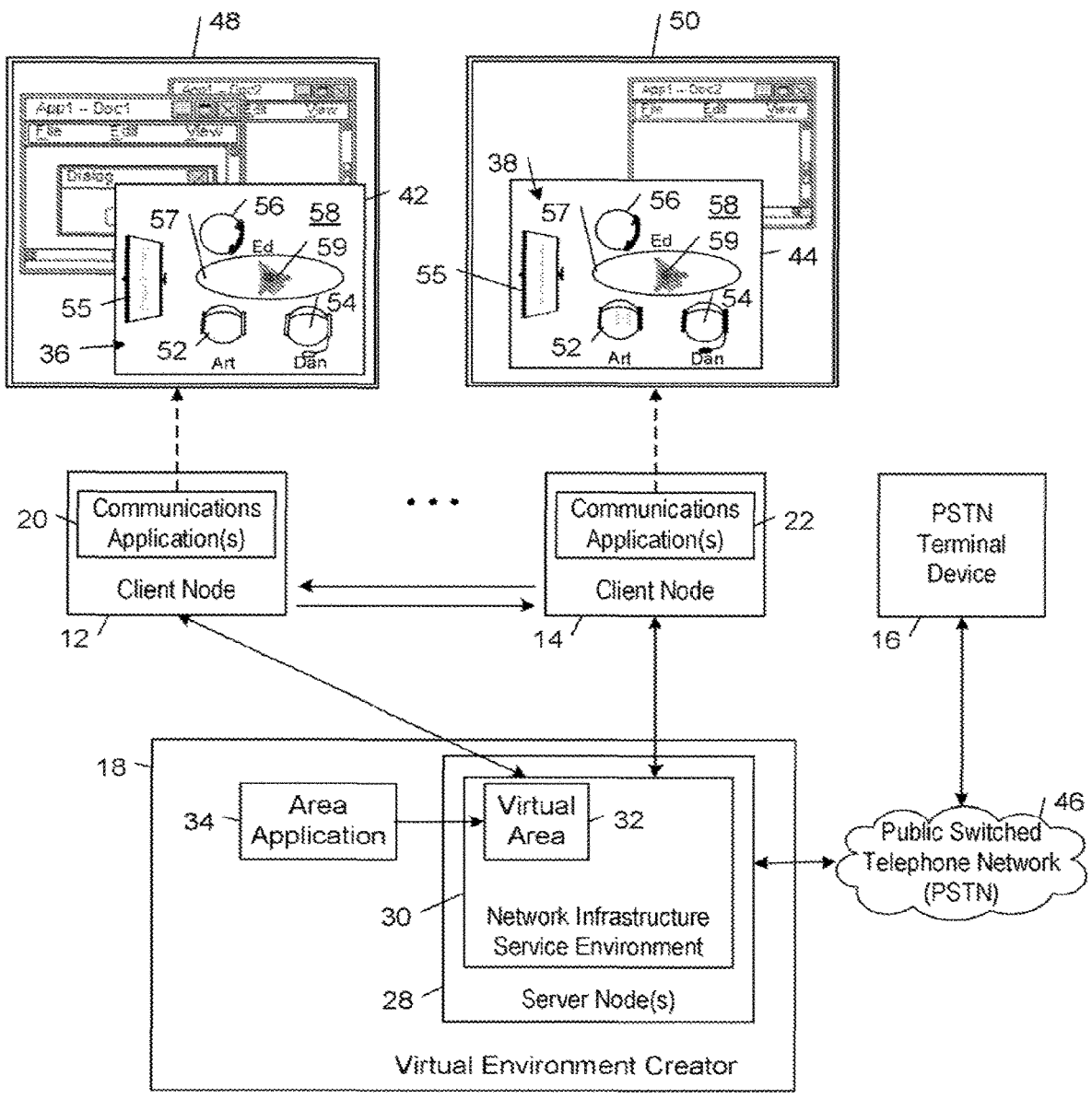
FIG. 1 is a block diagram of an example of a network communications environment that includes a first client network node, a second client network node, a PSTN device, and a virtual environment creator.

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

I. DEFINITION OF TERMS

A "communicant" is a person who communicates or otherwise interacts with other persons over one or more network connections, where the communication or interaction may or may not occur in the context of a virtual area. A "user" is a communicant who is operating a particular network node that defines a particular perspective for descriptive purposes.

A "computer" is any machine, device, or apparatus that processes data according to computer-readable instructions that are stored on a computer-readable medium either temporarily or permanently. A "computer operating system" is a software component of a computer system that manages and coordinates the performance of tasks and the sharing of computing and hardware resources. A "software application" (also referred to as software, an application, computer software, a computer application, a program, and a computer program) is a set of instructions that a computer can interpret and execute to perform one or more specific tasks. A "data file" is a block of information that durably stores data for use by a software application.

The term "computer-readable medium" refers to any tangible, non-transitory medium capable storing information (e.g., instructions and data) that is readable by a machine (e.g., a computer). Storage devices suitable for tangibly embodying such information include, but are not limited to, all forms of physical, non-transitory computer-readable memory, including, for example, semiconductor memory devices, such as random access memory (RAM), EPROM. EEPROM, and Flash memory devices, magnetic disks such as internal hard disks and removable hard disks, magneto-optical disks, DVD-ROM/RAM, and CD-ROM/RAM.

A "window" is a visual area of a display that typically includes a user interface. A window typically displays the output of a software process and typically enables a user to input commands or data for the software process. A window that has a parent is called a "child window." A window that has no parent, or whose parent is the desktop window, is called a "top-level window." A "desktop" is a system-defined window that paints the background of a graphical user interface (GUI) and serves as the base for all windows displayed by all software processes.

A "data sink" (referred to herein simply as a "sink") is any of a device (e.g., a computer), part of a device, or software that receives data.

A "data source" (referred to herein simply as a "source") is any of a device (e.g., a computer), part of a device, or software that originates data.

A "network node" (also referred to simply as a "node") is a junction or connection point in a communications network. Examples of network nodes include, but are not limited to, a terminal, a computer, and a network switch. A "server" network node is a host computer on a network that responds to requests for information or service. A "client network node" is a computer on a network that requests information or service from a server.

A Uniform Resource Identifier (URI) is a string of characters that identifies a network resource.

A "network resource" is anything that can be identified by a uniform resource identifier (URI) and accessed over a network, including an electronic document, an image, a source of information, a service, operators and operands of a mathematical equation, classes, properties, numeric values, and a collection of other resources.

A "network connection" is a link between two communicating network nodes. A "connection handle" is a pointer or identifier (e.g., a uniform resource identifier (URI)) that can be used to establish a network connection with a network resource. A "network communication" can include any type of information (e.g., text, voice, audio, video, electronic mail message, data file, motion data stream, and data packet) that is transmitted or otherwise conveyed from one network node to another network node over a network connection.

Synchronous conferencing refers to communications in which communicants participate at the same time. Synchronous conferencing encompasses all types of networked collaboration technologies, including instant messaging (e.g., text chat), audio conferencing, video conferencing, application sharing, and file sharing technologies.

A "communicant interaction" is any type of direct or indirect action or influence between a communicant and another network entity, which may include for example another communicant, a virtual area, or a network service. Examples of types of communicant communications include communicants communicating with each other in realtime, a communicant entering a virtual area, and a communicant requesting access to a resource from a network service.

"Presence" refers to the ability and willingness of a networked entity (e.g., a communicant, service, or device) to communicate, where such willingness affects the ability to detect and obtain information about the state of the entity on a network and the ability to connect to the entity.

A "realtime data stream" is data that is structured and processed in a continuous flow and is designed to be received with no delay or only imperceptible delay. Realtime data streams include digital representations of voice, video, user movements, facial expressions and other physical phenomena, as well as data within the computing environment that may benefit from rapid transmission, rapid execution, or both rapid transmission and rapid execution, including for example, avatar movement instructions, text chat, realtime data feeds (e.g., sensor data, machine control instructions, transaction streams and stock quote information feeds), screen shares, and file transfers.

A "virtual area" (also referred to as an "area" or a "place") is a representation of a computer-managed space or scene. Virtual areas typically are one-dimensional, two-dimensional, or three-dimensional representations; although in some examples a virtual area may correspond to a single point. Oftentimes, a virtual area is designed to simulate a physical, real-world space. For example, using a traditional computer monitor, a virtual area may be visualized as a two-dimensional graphic of a three-dimensional computer-generated space. However, virtual areas do not require an associated visualization. A virtual area typically refers to an instance of a virtual area schema, where the schema defines the structure and contents of a virtual area in terms of variables and the instance defines the structure and contents of a virtual area in terms of values that have been resolved from a particular context.

A "persistent virtual area" is a virtual area that persists even after all communicants have disconnected from the virtual area. The state of a persistent virtual area is preserved so that it can be restored the next time a communicant connects to the virtual area.

A "virtual area application" (also referred to as a "virtual area specification") is a description of a virtual area that is used in creating a virtual environment. A virtual area application typically includes definitions of geometry, physics, and realtime switching rules that are associated with one or more zones of the virtual area.

A "virtual area based communications application" is a client communications application that integrates realtime audio communications (and potentially other realtime communications, e.g., video, chat, and realtime other data stream) with visual presentations of interactions in a virtual area.

A "virtual environment" is a representation of a computer-managed space that includes at least one virtual area and supports realtime communications between communicants.

A "zone" is a region of a virtual area that is associated with at least one switching rule or governance rule. A "switching rule" is an instruction that specifies a connection or disconnection of one or more realtime data sources and one or more realtime data sinks subject to one or more conditions precedent. A switching rule controls switching (e.g., routing, connecting, and disconnecting) of realtime data streams between network nodes communicating in the context of a virtual area. A governance rule controls a communicant's access to a resource (e.g., an area, a region of an area, or the contents of that area or region), the scope of that access, and follow-on consequences of that access (e.g., a requirement that audit records relating to that access must be recorded). A "renderable zone" is a zone that is associated with a respective visualization.

A "position" in a virtual area refers to a location of a point or an area or a volume in the virtual area. A point typically is represented by a single set of one-dimensional, two-dimensional, or three-dimensional coordinates (e.g., x, y, z) that define a spot in the virtual area. An area typically is represented by the three-dimensional coordinates of three or more coplanar vertices that define a boundary of a closed two-dimensional shape in the virtual area. A volume typically is represented by the three-dimensional coordinates of four or more non-coplanar vertices that define a closed boundary of a three-dimensional shape in the virtual area.

A "spatial state" is an attribute that describes where a user has presence in a virtual area. The spatial state attribute typically has a respective value (e.g., a zone_ID value) for each of the zones in which the user has presence.

A "communication state" is an attribute that describes a state of a respective communication channel over which a respective one of the communicants is configured to communicate.

As used herein, the term "includes" means includes but not limited to, the term "including" means including but not limited to. The term "based on" means based at least in part on.

II. VIRTUAL AREA BASED TELEPHONY COMMUNICATIONS

The examples that are described herein provide virtual area based telephony systems and methods that enable a user of a Public Switched Telephone Network (PSTN) terminal device to participate in a virtual area based communications. Some examples enable the PSTN terminal device user to connect to audio data that is associated with a persistent virtual area. In this way, the PSTN terminal device user can participate in realtime communication sessions with other communicants in the virtual area, retrieve data that is stored in association with the virtual area, or store data in association with the virtual area. Some examples enable a communicant in a persistent virtual area to bring (or "get") a PSTN terminal device user into a virtual area based communication session simply by calling the PSTN terminal device. Some examples enable a PSTN terminal device user to establish a presence in or interaction with data associated a virtual area or a particular zone of a virtual by calling a telephone number associated with the virtual area or zone.

FIG. 1 shows an embodiment of an exemplary network communications environment 10 that includes a first client network node 12, a second client network node 14, a PSTN device 16, and a virtual environment creator 18 that are interconnected by a network (not shown) that support the transmission of a wide variety of different media types (e.g., text, voice, audio, video, and other data) between network nodes.

Each of the first client network node 12 and the second client network node 14 includes input/output (I/O) hardware, a processor, and a computer-readable memory that stores a respective instance 20, 22 of at least one virtual-area-enabled communications application that is executable by the processor. Each of the network nodes 12, 14 has a respective set of one or more sources and an exemplary set of one or more sinks. Exemplary sources include an audio source (e.g., an audio capture device, such as a microphone), a video source (e.g., a video capture device, such as a video camera), a chat source (e.g., a text capture device, such as a keyboard), a motion data source (e.g., a pointing device, such as a computer mouse), and other sources (e.g., file sharing source or a source of a customized real-time data stream). Exemplary sinks include an audio sink (e.g., an audio rendering device, such as a speaker or headphones), a video sink (e.g., a video rendering device, such as a display monitor), a chat sink (e.g., a text rendering device, such as a display monitor), a motion data sink (e.g., a movement rendering device, such as a display monitor), and other sinks (e.g., a printer for printing shared files, a device for rendering real-time data streams different from those already described, or software that processes real-time streams for analysis or customized display).

The communications applications 20, 22 respectively operating on the client nodes 12, 14 typically include software and hardware resources which, together with administrative policies, user preferences (including preferences regarding the exportation of the user's presence and the connection of the user to the area applications 34 and other communicants), and other settings, define a local configuration that influences the administration of realtime connections with other network nodes. Among the software components typically executing on the client network nodes 12, 14 are a user interface component and a browser component. The browser component provides a set of web browsing functions, including browser functions, document viewing functions, and data downloading functions. The user interface component generates a graphical user interface that interfaces the user to the realtime communications and network browsing functionalities of the browser component. The browser component may be integrated into the communications applications 20, 22 or it may be implemented by a separate browser component (e.g., a plug-in) that exposes an API through which the communications applications 20, 22 may call methods that are available from the browser component, including browsing methods, document viewing methods, and data downloading methods.

The PSTN terminal device 16 is any device that communicates over the PSTN, including mobile devices (e.g., mobile phones and portable computing devices, such as tablet and notebook computers) and fixed-line telephones.

In the illustrated embodiment, the virtual environment creator 18 includes at least one server network node(s) 28 that provides a network infrastructure service environment 30 that manages sessions of the first and second client nodes 12, 14 and the PSTN terminal device 16 in one or more virtual areas 32 in accordance with respective virtual area applications 34. Each of the virtual area applications 34 is hosted by a respective one of the virtual areas 32 and includes a description of the respective virtual area 32. Communicants respectively operating from the client network nodes 12, 14 connect to the virtual area applications 34 through the communications applications 20, 22. The server network node(s) 28 also includes components (e.g., a Voice eXstensible Markup Language (VXML) interpreter, a speech recognition engine, a text to speech synthesizer, and a Dual Tone Multi-Frequency (DTMF) decoder) that enable a user of the PSTN terminal device 16 to connect to the virtual area applications 34 through one or more PSTN modalities.

The network infrastructure service environment 30 typically includes one or more network infrastructure services that cooperate with the communications applications 20, 22 in the process of establishing and administering network connections between the client nodes 12, 14 and other network nodes, including the PSTN terminal device 16. Among the network infrastructure services that are included in an exemplary embodiment of the network infrastructure service environment 30 are an account service, a security service, an area service, a rendezvous service, and an interaction service. The structure, operation, and components of such an embodiment of the network infrastructure service environment 30 are described in U.S. patent application Ser. No. 12/825,512, filed Jun. 29, 2010.

The communications applications 20, 22, the area applications 34, and the network infrastructure service environment 30 together provide a platform (referred to herein as "the platform") that administers the realtime connections with network nodes in a communication context that is defined by an instance of a virtual area subject to a set of constraints that control access to the virtual area instance.

In the illustrated embodiment, the communications applications 20, 22 operating on the first and second client network nodes 12, 14 present respective spatial visualizations 36, 38 (or views) of the virtual areas 32 in accordance with data received from the network infrastructure service environment 30. The communications applications 20, 22 also provide respective interfaces for receiving commands from the communicants and providing a spatial interface that enhances the realtime communications between the communicants. The spatial visualizations 36, 38 include respective graphical representations 52, 54 (referred to herein as "avatars" or "sprites") of the client communicants in spatial relation to a graphical representation 58 of a virtual area. The spatial visualizations 36, 38 also may include other objects. Examples of such props include a view screen object 55 for application sharing, a table object 57 for file sharing, and a conferencing object 59 for initiating telephone calls to PSTN terminal devices. The user of the PSTN terminal device 16 also is represented in the virtual areas by a respective avatar 56. In some examples, the avatars 62, 64, 70 are moved about the virtual areas 32 based on commands that are input by the communicants at their respective network nodes 12, 14, 16.

The spatial visualizations 36, 38 on the client nodes 12, 14 are presented in respective windows 42, 44 that are generated by the virtual area enabled communications applications 20, 22. The communication application windows 42, 44 typically are displayed on respective "desktops" or other system-defined base windows 48, 50 on the display hardware of the client nodes 12, 14.

The platform tracks communicants' realtime availabilities and activities across the different communication contexts that are defined by the area applications 34. This information is presented to the communicants in the form of realtime visualizations that enable the communicants to make more informed network interaction decisions (e.g., when to interact with a contact) and encourages the communicants to initiate interactions with other communicants and to join contexts (e.g., an ongoing conversation between communicants) of which the communicants otherwise would not have been aware. In some embodiments, the realtime visualization includes visual cues as to the presence and activities of the communicants in the contexts of the server applications. The presentation of these visual cues typically depends on one or more of governance rules associated with the virtual areas 32, administrative policies, and user preferences (including preferences regarding the exportation of the user's presence and the connection of the user to areas and other communicants), which may define tiered relationship based predicates that control access to presence information and/or resources on a zone-by-zone basis.

In some embodiments, the server network node(s) 28 remotely manages client communication sessions and remotely configures audio and graphic rendering engines on the client network nodes 12, 14, as well as switching of data streams by sending instructions (also referred to as definitions) from the remotely hosted area applications 34 to the client network nodes in accordance with the stream transport protocol described in U.S. patent application Ser. No. 12/825,512, filed Jun. 29, 2010. In some of these embodiments, the server network node(s) 28 send to each of the client nodes 12, 14 provisioning messages that configure the client nodes 12, 14 to interconnect respective data streams between active ones of their complementary sources and sinks in accordance with switching rules specified in the area applications 34. In some embodiments, server network node(s) 28 remotely configures the communications applications 20, 22 to establish realtime data stream connections between the first and second client network nodes 12, 14 and other network nodes sharing the virtual area 32 based on the positions of the communicants' avatars in the virtual area 32.

The server network node(s) 28 also manages connection of the PSTN terminal device 16 to the virtual area 32 so that a PSTN terminal device user can participate in virtual area based communications (e.g., communicate with one or more other communicants who are in the virtual area 32, or retrieve data from or store data in the virtual area 32).

Figure 2:
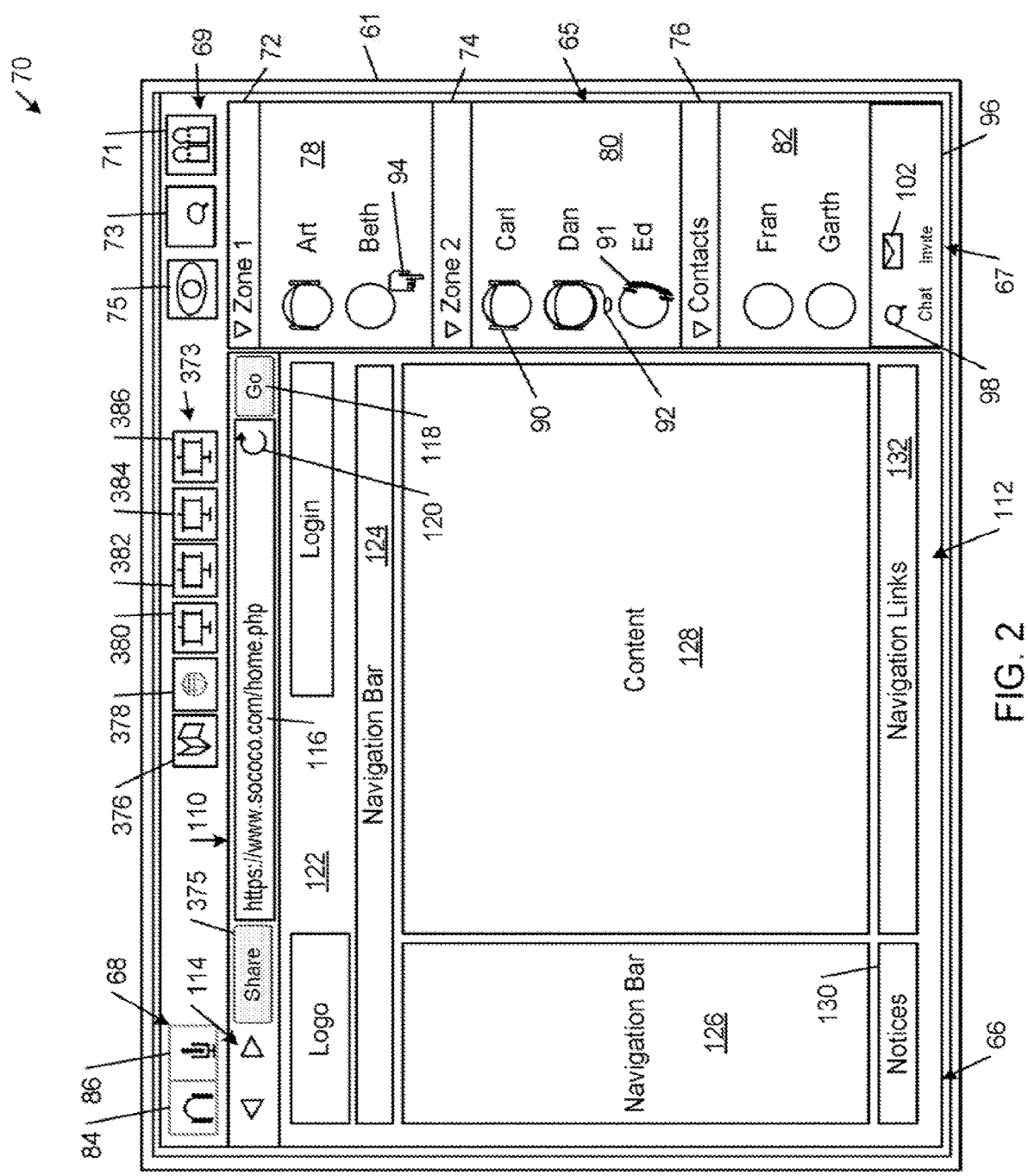
FIGS. 2-4 are diagrammatic views of graphical user interface examples.

FIG. 2 shows an exemplary graphical user interface 70 that is generated by an example of the communications application 20 in a window 61 on a display of the client network node from which a user of the client application ("Art" in this example) is operating. The graphical user interface 70 includes a people panel 65, a viewer panel 66, a people interaction toolbar 67, an audio interaction toolbar 68, and a set of panel view controls 69. The panel view controls 69 include a people panel button 71 for opening and closing the people panel 65, a Chat panel button 73 for opening and closing a Chat panel, and a viewer panel button 75 for opening and closing the viewer panel 66.

The people panel 66 depicts the realtime availabilities and activities of some or all of Art's contacts across different communication contexts. In the example shown in FIG. 2, the people panel 66 shows Art's communicants segmented into two virtual area groups 72, 74 and a contacts group 76. The virtual area groups 72, 74 correspond to each of the area applications 34 of which Art is a member with respect to which at least one of Art and Art's contacts is present. The contacts group 76 contains all or a selected portion of Art's contacts that are not represented in any of the virtual area groups. The first virtual area group 72 of communicants is contained within a section 78 (labeled with a header bar entitled "Zone 1") that identifies all the communicants who have a presence in the area application "Application 1". The second virtual area group 74 of communicants is contained within a section 80 (labeled with a header bar entitled "Zone 2") that identifies all the communicants who have a presence in the area application "Application 2". The contacts group 76 of communicants is contained within a section 82 (labeled with a header bar entitled "Contacts") that identifies all of Art's contacts who are not shown in any of the first and second virtual area groups 72, 74 (i.e., they either are not members of or not present in any of Zone 1 and Zone 2).

In the example shown in FIG. 2, the virtual area sections 78, 80 contain the graphical representations (avatars) of the communicants (including at least one of Art or Art's contacts) who currently have presence in the respective area applications 34, and the contacts section 82 contains graphical representations (avatars) of all of the remaining ones of Art's contacts that are not present in or not members of any of Zone 1 and Zone 2. In the illustrated example: Art and Beth are members of server Zone 1; Art, Carl, Dan, and Ed are members of server Zone 2; and Fran and Garth are not members of server Zone 1 nor server Zone 2. In this example, Fran and Garth are contacts of Art who are not presented in Zone 1 or Zone 2.

Each communicant is represented graphically by a respective circular sprite that is labeled with a respective user name of the communicant (i.e., "Art," "Beth," "Carl," "Dan," "Ed," "Fran," and "Garth"). Each sprite also may be associated with a respective status line that includes additional information about the communicant. In some embodiments, each status line can include one or more of the following information: location of presence (e.g., a server application or a zone of that sever application); availability (e.g., busy, idle); a status message (e.g., "Out of the office next Wednesday"); and the name of the client node from which the communicant is operating (e.g., "workstation 1" or "mobile phone"). In some embodiments, the ordering of the spatial positions (e.g., from top to bottom) of the communicant avatars in each of the sections 78, 80, 82 is alphabetical by user name. In other embodiments, the spatial positions of the communicant avatars in each of the server application sections 78, 80 are ordered in accordance with the temporal ordering of the communicants in terms of the times when the communicants established their respective presences with the server applications. The spatial positions of the communicant avatars in the contacts section 82 may be sorted alphabetically by user name, according to frequency of contact, according to recentness of contact, or according to other sorting or filtering criteria.

The activities of the communicants in the contexts of the area applications 34 may be inferred from the states of various communication channels over which the respective communicants are configured to communicate. The states of the communication channels are shown in the graphical user interface 70 by visual cues that are depicted in association with the graphical representations of the communicants in the sections 78, 80, 82. For example, the "on" or "off" state of a communicant's local speaker channel is depicted by the presence or absence of a headphones graphic 90 on the communicant's sprite. When the speakers of the communicant who is represented by the sprite are on, the headphones graphic 90 is present (see sprites Art, Carl, and Dan) and, when the communicant's speakers are off, the headphones graphic 90 is absent. The "on" or "off" state of the communicant's microphone is depicted by the presence or absence of a microphone graphic 92 on the communicant's sprite. When the microphone is on, the microphone graphic 92 is present; and, when the microphone is off, the microphone graphic 92 is absent. A PSTN terminal device user is represented in the spatial visualization by a sprite that includes a telephone handset graphic 91 (see sprite Ed). The headphones graphic 90, the microphone graphic 92, and the headset graphic 91 provide visual cues of the activity states of the communicant's sound playback and microphone devices. In addition, the current activity state of a communicant's microphone channel is indicated by a dynamic visualization that lightens and darkens the communicant's avatar in realtime to reflect the presence or absence of audio data on the microphone channel. Thus, whether or not their local speakers are turned on, communicants can determine when another communicant is speaking by the "blinking" of the coloration of that communicant's avatar. The activity state of a communicant's text chat channel is depicted by the presence or absence of the hand graphic 94 adjacent the communicant's sprite (see sprite Beth). Thus, when a communicant is transmitting text chat data to another network node the hand graphic 94 is present, and when a communicant is not transmitting text chat data the hand graphic 94 is not present. In some embodiments, text chat data is transmitted only when keyboard keys are depressed, in which case the visualization of the communicant's text channel appears as a flashing on and off of the hand graphic 94.

In the example shown in FIG. 2, members of an area application are able to receive the visual cues of the communicant activities occurring in the context of that area application whether or not the member is present. Thus, the graphical user interface 70 that is presented to Art shows visual cues indicating the communication channel states of the communicants present in Zone 1 (where Art is present) and the communication channel states of the communicants present in Zone 2 (where Art is not present).

The audio interaction toolbar 68 includes a headphone control 84 that enables Art to toggle on and off the local speakers of the client network node, and a microphone control 86 that enables Art to toggle on and off the local microphone of the client network node.

Additional details regarding embodiments of the people panel 65 are described in U.S. Provisional Patent Application No. 61/373,914, filed Aug. 16, 2010, and U.S. patent application Ser. No. 12/354,709, filed Jan. 15, 2009.

The viewer panel 66 includes a navigation area 110 and a display area 112.

The navigation area 110 includes forward and back buttons 114, a location bar 116, a Go button 118, and a reload button 120. The forward and back buttons 114 enable a user to traverse a navigation stack of uniform resource identifier (URI) addresses (e.g., a linked list of previously visited URLs). The location bar 116 allows a user to specify a URI address of a network resource, and the Go button 118 invokes one or more browser functions on the client network node to navigate to the specified URI address and render the network resource at the specified URI address in the display area 112. The reload button 120 invokes one or more browser functions on the client network node to reload the graphic representation of the network resource currently displayed in the display area 112.

The display area 112 contains the rendered depictions of network resources located at the URI address specified in the navigation area 110. In the example shown in FIG. 14, the viewer panel 66 is in the browser view mode and shows a rendered view of the network resource (a web page in this example) that is located at the URL https://www.sococo-.com/home.php, as indicated in the location bar 116. In the illustrated example, the display area 110 shows a web page that includes a header section 122, a top navigation bar 124, a side navigation bar 126, a contents section 128, a notices section 130, and a navigation links section 132.

The people interaction toolbar 67 includes a Chat button 98 and an Invite button 102. Selection of the Chat button 98 opens a Chat panel 140 (see FIG. 4) that enables Art to initiate a chat with other communicants who are present in the area application where Art is present (i.e., Zone 1 in the illustrated example). Selection of the Invite button 102 opens an Invite window that enables Art to invite one or more communicants to a selected virtual area location (e.g., an area application or zone within that area application). Additional details regarding embodiments of the methods and functions invoked by the Chat button 98 and the Invite button 102 are described in U.S. patent application Ser. No. 12/354,709, filed Jan. 15, 2009, and U.S. Provisional Patent Application No. 61/373,914, filed Aug. 16, 2010.

In addition to the control and panel elements of the graphical user interface 70 (e.g., the people panel 65, the viewer panel 66, the people interaction toolbar 67, the audio interaction toolbar 68, and the panel view controls 71, 73, 75), the graphical user interface 70 includes a Share button 375 and a set 373 of Viewer Panel control buttons, including a Map button 376, a Browse button 378, and four View Screen buttons 380-386. The Share button 375 initiates a screen share of the contents of the display area 112 of the viewer panel 66 in connection with a view screen in a virtual area. These contents include renderings of any information that is received by the browser component in connection with the network resource identified in the location bar 116, and a document or application that is being shared by the user in connection with a view screen object in a virtual area. The Map button 376 sets the view presented in the viewer panel 66 to a map view of the virtual area. The Browse button 378 sets the view presented in the viewer panel 66 to a browser view. Each of the four View Screen buttons 380-386 sets the viewer panel 66 to display the content the content being shared in connection with a corresponding one of the view screens in the virtual area.

Figure 3:
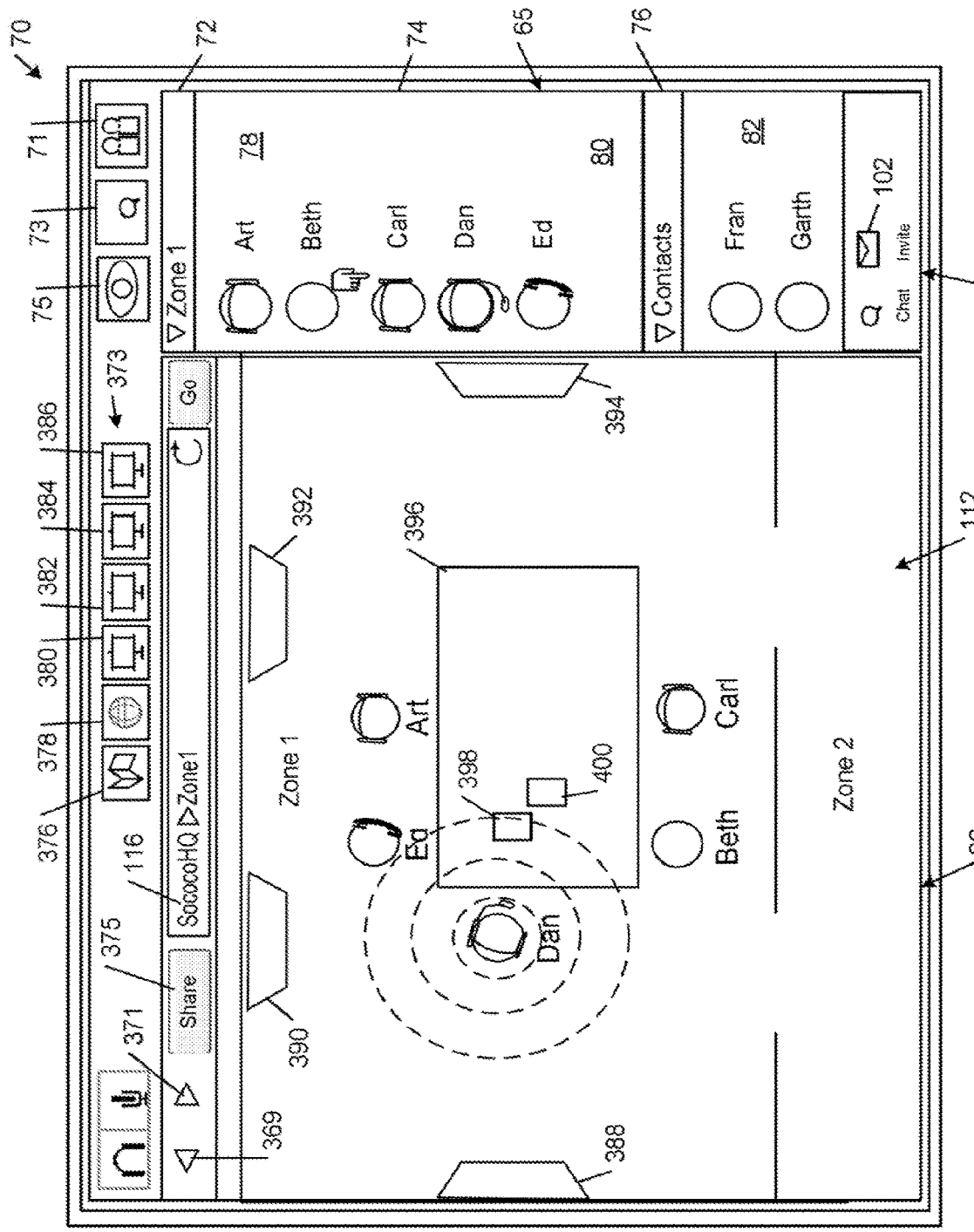

FIG. 3 shows an example of the graphical user interface 70 in the Map view mode presenting in the viewer panel 66 a rendered view of an example of a virtual area that includes a first zone (Zone 1) and a second zone (Zone 2). The first zone is located at the location SococoHQ/Zone1, as indicated in the location bar 110. This address indicates that Zone 1 is a zone within the area SococoHQ.

Each of the communicants who is present in the virtual area is represented graphically by a respective avatar that corresponds to the communicant's avatar that is shown in the people panel 65. The virtual area is represented graphically by a two-dimensional top view of a rectangular space. In some examples, the communicants' sprites automatically are positioned in predetermined locations (or "seats") in the virtual area when the communicants initially enter the virtual area.

The virtual area includes four view screen props 388, 390, 392, 394 and a table prop 396. Communicants interact with the props by selecting them with an input device (e.g., by single-clicking on the props with a computer mouse, touch pad, touch screen, or the like). The view screen props 388-394 are associated with application sharing functionality of the platform that enables communicants to share applications operating on their respective client network nodes. The application sharing functionality is invoked by activating a view screen (e.g., by single-clicking the view screen object with an input device). In some embodiments, the platform provides visual cues that indicate whether or not a communicant is sharing an application over an application sharing channel. For example, in response to a communicant's selection of the view screen prop, the communicant's sprite automatically is moved to a position in the graphical representation of the virtual area that is adjacent the view screen prop. The position of a communicant's sprite adjacent the view screen prop indicates that the communicant currently is sharing or is about to share an application with the other communicants in the virtual area. In addition, the avatar of each communicant who is viewing a shared application is depicted with a pair of "eyes" to indicate that the represented communicants are viewing the content being shared in connection with the view screen props. The graphical depiction of view screen prop is changed depending on whether or not an active application sharing session is occurring. For example, the depicted color of the view screen may change from a brighter color during an active application sharing session to a darker color when there is no application sharing taking place. Examples of the application sharing process are described in connection with FIGS. 26-28 of U.S. patent application Ser. No. 12/354,709, filed Jan. 15, 2009, and in U.S. patent application Ser. No. 12/418,270, filed Apr. 3, 2009.

The table prop 396 is associated with file share functionality of the platform that enables communicants to upload computer data files to server storage in association with the virtual area and to download data files that are associated with the virtual area from the server storage to the respective client network nodes. In example shown in FIG. 3, there are two document objects 398, 400 that are associated with the table prop 396. The document objects 398, 400 are linked to respective documents that are have been shared in the virtual area and stored in server storage. Any of the document objects 398, 400 may be selected by a communicant (e.g., by double-clicking the document object 190 with an input device, such as a computer mouse) to initiate downloading of the associated document to the communicant's client network node. Additional details regarding the structure, function, and operation of the table prop 396 may be obtained from U.S. patent application Ser. No. 12/354,709, filed Jan. 15, 2009.

In the Map view mode, the navigational controls of the graphical user interface 70 allow the user to traverse a path through the virtual environment in accordance with a navigational model that is tied to the underlying spatial hierarchy of virtual area locations and objects (e.g., props) within the locations. The network infrastructure service environment records the path traversed by the user. In some embodiments, the network infrastructure service environment records a history that includes a temporally ordered list of views of the virtual area locations that are presented to the user as the user navigates through the virtual area. Each view typically corresponds to a view of a respective renderable zone of the virtual area. In these embodiments, the navigation controls enable the user to move to selected ones of the zones in the history. The navigation controls also include a graphical representation of a depth path that shows the location in the spatial hierarchy that corresponds to the user's current view of the virtual area. In some embodiments, the graphical representation of the depth path includes a respective user-selectable link to a respective view of each of the preceding levels in the spatial hierarchical model of the virtual area above the current view. The back button 369 corresponds to a backward control that enables the user to incrementally move backward to preceding ones of the zones in the history of the zones that were traversed by the user. The forward button 371 corresponds to a forward control that enables the user to incrementally move forward to successive ones of the zones in the history of the zones that were traversed by the user. Some examples additionally include a placemarks button that activates a placemarking control for storing links to zones and a placemark navigation control for viewing a list of links to previously placemarked zones. In response to user selection of the placemarking control, a placemark is created by storing an image of the location shown in the current view in association with a hyperlink to the corresponding location in the virtual area. In response to a user selection of the placemark navigation control, a placemarks window is presented to the user. The placemarks window includes live visualizations of all locations that have been placemarked by the user. Each of the images in the placemarks window is associated with a respective user-selectable hyperlink. In response to user selection of one of the hyperlinks in the placemarks window, a view of the virtual area corresponding to the location associated with the selected hyperlink is automatically displayed in the browsing area of the graphical user interface 70. Some examples include home button corresponds to a control that returns the user to a view of a designated "home" location in the virtual environment. Additional details regarding the structure, function, and operation of examples of the navigation controls are described in U.S. patent application Ser. No. 12/354,709, filed Jan. 15, 2009.

Figure 4:
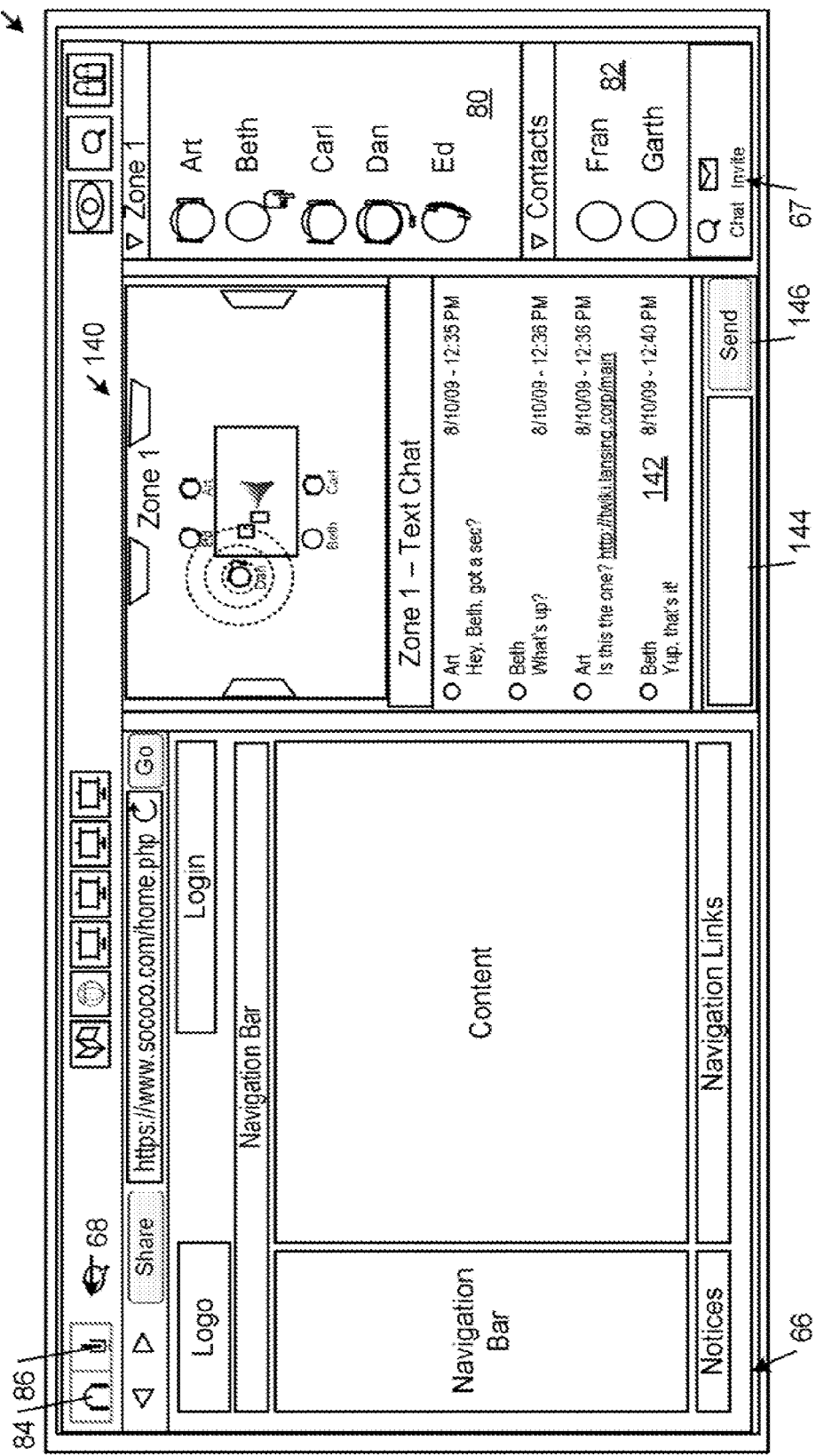

FIG. 4 shows an example of the graphical user interface 70 when the people panel 65, a Chat panel 402, and the viewer panel 66 are open.

Activating the Chat panel button 73 or the Chat button 98 opens the Chat panel 140. When the Chat panel button 73 is activated, the Chanel panel 140 opens to show a chat interface for a persistent virtual chat area for interactions occurring in connection with a respective virtual area. In the example shown in FIG. 7, Art activated the Chat panel button 73 at the time he was present in Zone 1; therefore, the Chat panel 140 shown in FIG. 4 contains the persistent virtual chat area for text chat interactions occurring in connection with Zone 1. When the Chat button 98 is activated, on the other hand, the Chat panel 140 opens to show a chat interface for a persistent personal virtual area for interactions between Art and a selected one of the communicants. Examples of personal virtual areas are described in U.S. patent application Ser. No. 12/509,658, filed Jul. 27, 2009.

The chat interface of the Chat panel 140 includes a chat log area 142, a text box 144, and a Send button 146. The Chat panel 402 also includes a minimap view of a virtual area (Zone 1). In this example, the user may enter text messages in the text box 144 and activate the Send button 146 to transmit the text messages to the other communicants who are present in the virtual area.

The user may enter text messages in the text box 144 and transmit the text messages to the other communicants who are in the same chat session by selecting the Send button 146. The chat log area 142 displays a log of current and optionally prior events that are associated with Application 1. An exemplary set of events that may be displayed in the chat log area 142 include: text messages that the user has exchanged with other communicants in Application 1; changes in the presence status of communicants in Application 1; changes in the speaker and microphone settings of the communicants in the Application 1; and the status of the props (discussed below), including references to any applications and data files that are shared in connection with the props. In the illustrated embodiments, the events are labeled by the communicant's name followed by content associated with the event (e.g., a text message) or a description of the event.

The Chat panel 140 provides a context for organizing the presentation of the events that are displayed in the chat log area 142. For example, in the illustrated embodiment, each of the displayed events is labeled with a respective tag that visually correlates with the appearance of the sprite of the communicant that sourced the displayed event. In particular, each of the events that is sourced by a particular one of the communicants is labeled with a respective icon 148, 150, 152, 154 with a visual appearance (e.g., color-code, or design pattern) that matches the visual appearance of that communicant's sprite. In this example, the color of the icons 148, 152 matches the color of the body of Art's sprite, and the color of the icon 150, 154 matches the color of the body of Beth's sprite.

Figure 5:
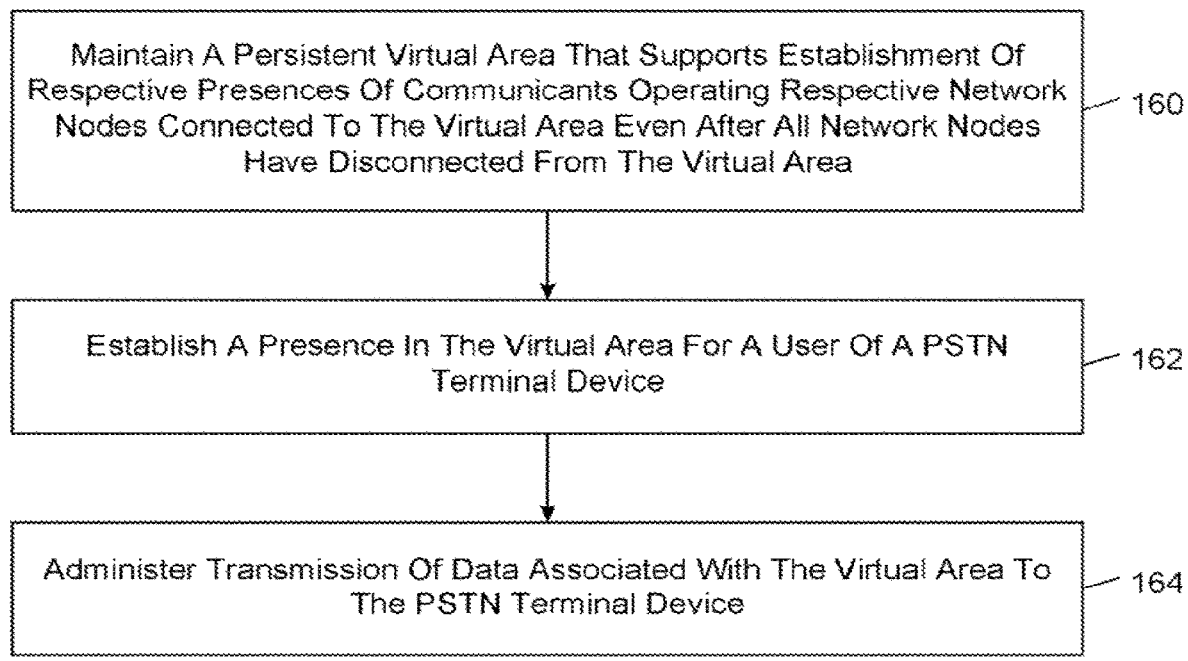
FIG. 5 is a flow diagram of an example of a method of interfacing a PSTN device terminal user to a virtual area.

FIG. 5 shows an example of a method by which an example of the virtual environment creator 18 interfaces a PSTN terminal device user to a virtual area.

In accordance with the method of FIG. 5, the virtual environment creator 18 maintains a persistent virtual area that supports establishment of respective presences of communicants operating respective network nodes connected to the virtual area even after all network nodes have disconnected from the virtual area (FIG. 2, block 160). The virtual area typically has one or more zones. One or more of the virtual area and the one or more zones of the virtual area typically is associated with at least one respective telephone number (e.g., a direct inward dialing (DID) number or a caller ID number).

The virtual environment creator 18 establishes a presence in the virtual area 32 for a user of the PSTN terminal device 16 (FIG. 2, block 162). The presence of the PSTN terminal device user may be established in the virtual area or in a particular zone of the virtual area. The presence of the PSTN terminal device user may be established, for example, in response to a request by a communicant who is present in the virtual area to call the PSTN terminal device 16 or in response to receipt of a telephone call from the PSTN terminal device 16.

The virtual environment creator 18 administers transmission of data associated with the virtual area to the PSTN terminal device 16 (FIG. 2, block 164). The transmitted data typically is any type of data (e.g., audio data or text data) that can be rendered by the PSTN terminal device 16 or can be converted by conversion device or service (e.g., a telephony service provider) into a format (e.g., audio data via a text-to-speech synthesizer) that can be rendered by the PSTN terminal device 16.

In some examples, the virtual environment creator 18 establishes a respective presence in the virtual area 32 for a communicant operating a respective one of the client network nodes 12, 14. The virtual environment creator 18 manages establishment of a realtime audio connection between the client network node 12 and the PSTN terminal device 16 in association with the virtual area 32. The virtual environment creator 18 also typically stores persistent records describing interactions between the PSTN terminal device user and the communicant operating the client network node 12 in the virtual area 32.

In some examples, the virtual environment creator 18 initiates the realtime audio connection with the PSTN terminal device 16 in response to a request received from the client network node 12. The request typically includes a telephone number that is associated with the PSTN terminal device 16. In the process of initiating the realtime audio connection, the virtual environment creator 18 typically transmits the telephone number to a PSTN service provider (e.g., an Internet Telephony Service Provider (ITSP)), which administers connections with the PSTN terminal device 16. The virtual environment creator 18 also typically transmits a telephone number (e.g., a caller ID number) that associated with the virtual area to the PSTN service provider. In some examples, the virtual area is associated with a spatial visualization, and the request is received from the client network node 12 in connection with the spatial visualization. In some of these examples, the spatial visualization includes a graphic representation of a room and a graphic representation of audio call connection object (e.g., a conferencing object) in the room, and the request is received in connection with the audio call connection object.

In some examples, the virtual environment creator 18 initiates the realtime audio connection in response to a request received in connection with the PSTN terminal device 16. In some of these examples, the virtual area 32 or a particular zone of the virtual area 32 is associated with a telephone number (e.g., a Direct Inward Dialing number (DID)), and the request includes the telephone number. The virtual environment creator 18 establishes a presence for the PSTN terminal device user in the area or zone that is associated with the telephone number.

In some examples, the virtual environment creator 18 manages a current realtime communication session between the communicant and the PSTN terminal device user in the virtual area 32. In this process, the virtual environment creator 18 typically specifies locations of graphical representations of the user and the communicant in spatial relation to a graphical representation of the virtual area 32. In some of these examples, based on entry of another communicant operating a second client network node 14 into the virtual area 32, the virtual environment creator 18 administers establishment of a respective audio connection between the other client network node 14 and each of the first client network node 12 and the PSTN terminal device 16.

In some examples, the virtual environment creator 18 derives audio data that is transmitted to the PSTN terminal device 16 from one or more realtime audio data streams that are respectively received from one or more client network nodes being operated by one or more respective communicants who are present in the virtual area 32. In some of these examples, the virtual environment creator 18 receives each of the one or more realtime audio data streams from a respective one of the one or more client network nodes over a respective peer-to-peer network connection. In this process, the virtual environment creator 18 may receive respective realtime audio data streams from multiple client network nodes, in which case the virtual environment creator 18 derives the audio data from the realtime audio data streams by mixing the realtime data streams. The virtual environment creator 18 typically transmits the derived audio data to the PSTN terminal synchronously with receipt of the one or more realtime audio data streams in a realtime communication session between the user of the PSTN terminal device and the one or more respective communicants.

In some examples, the virtual environment creator 18 stores data in association with the virtual area 32 such that the stored data remains associated with the virtual area 32 independent of any communicant presence in the virtual area. For example, the virtual environment creator 18 may store a recording of one or more realtime audio streams (or a mix of such audio streams) received from communicants who are present in virtual area. Subsequently, the virtual environment creator 18 may transmit audio data derived from the stored recording to one or more of the PSTN terminal device 16 and the client network nodes 12, 14 whenever they connect to the virtual area and select an associated audio playback object in the virtual area.

Figure 6A:
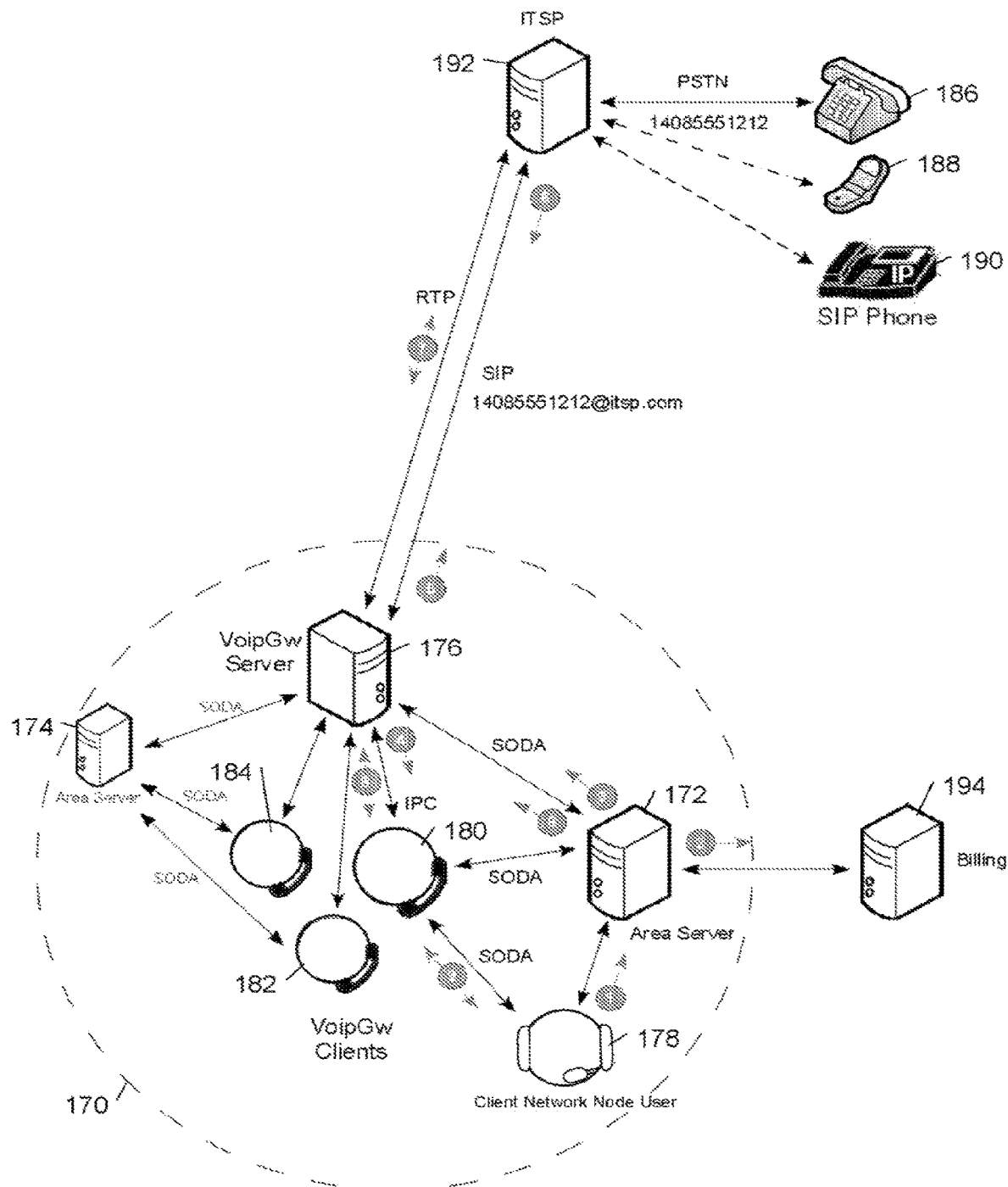
FIG. 6A is a block diagram of an example of a network communications environment that supports virtual area based telephony communications.

FIG. 6A shows an example 170 of the network communications environment 10 that supports virtual area based telephony communications in which a communicant in a virtual area is able to bring a PSTN terminal device user into the virtual area by calling the user's PSTN terminal device from the virtual area.

The network communications environment 170 includes first and second area servers 172, 174 and a Voice Over Internet Protocol (VOIP) gateway server 176. Each of the first and second area servers 172, 174 executes a respective instance of the area service that administers a respective virtual area in which communicants can interact with each other and with data stored in association with the virtual areas. In the illustrated example, the first area server 172 creates a first virtual area in which a client network node user (represented by a sprite 178) and a first PSTN terminal device user (represented by a sprite 180) are present. The second area server 174 creates a second virtual area in which second and third PSTN terminal device users (represented by sprites 182, 184) are present. In this example, the first, second, and third PSTN device users are referred to as VOIP gateway clients because they interface with the first and second virtual areas through respective gateway client applications that are executed by the VOIP gateway server 176. The VOIP gateway server 76 communicates with the user's PSTN terminal devices 186, 188, 190 (e.g., a fixed-line telephone, a mobile telephone, and a SIP phone) through an Internet Telephony Service Provider (ITSP) 192. The ITSP 192 communicates with the PSTN terminal devices 186-190 over the PSTN. In the illustrated example, the area servers 172, 174 communicate with an optional billing server 194 that manages user billing accounts to which telephony and other charges are applied.

Figure 6B:
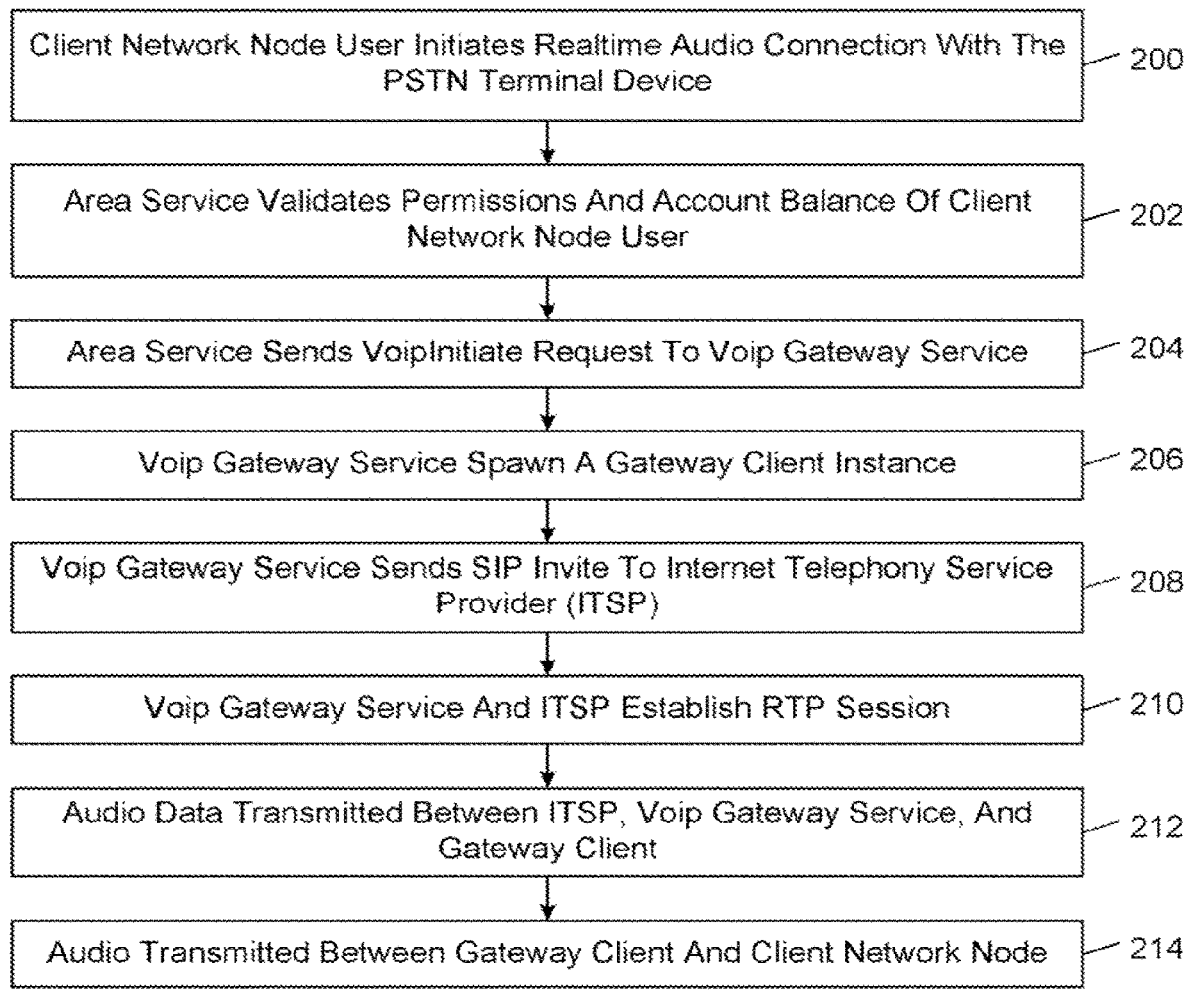
FIG. 6B is a flow diagram of an example virtual area based telephony method.

FIG. 6B shows an example virtual area based telephony method in which a client network node user (e.g., the user of client network node 12) initiates a virtual area based telephony communication with a user of a PSTN terminal device (e.g., PSTN device 186).

In accordance with the method of FIG. 6B, the user of the client network node 12 initiates a realtime audio connection with the PSTN terminal device 186 (FIG. 6B, block 200). In this process, the client network node user logs into the first virtual area through the first area service instance running on the first area server 172. The first area server 172 creates an instance of the first virtual area and establishes a presence for the user in the first virtual area. After a presence for the user has been established, the user may initiate a telephone call to the user of the PSTN terminal device 186 through a conferencing object in the first virtual area.

In response to the user input received in connection with the conferencing object, the first area service instance validates the permissions and account balance of the user of the client network node 12 to determine whether or not the user is allowed to establish the virtual area based telephony session with the PSTN terminal device (FIG. 6B, block 202). The first area service instance will not establish the virtual area based telephony session if the governance rules associated with the virtual area do not allow the client network node user to call the PSTN terminal device user; or if the user's account balance is insufficient to make the call, in which case the user may be prompted to authorize an increase to the account balance.

After the permissions and account balance of the user of the client network node 12 have been validated, the first area service instance sends a Voipinitiate request to the VOIP gateway service running on the VOIP gateway server 176 (FIG. 6B, block 204).

In response to receipt of the Voipinitiate request, the VOIP gateway server 176 spawns an instance of a gateway client for the PSTN terminal device 186 (FIG. 6B, Block 206). In some examples, the gateway client corresponds to a modified version of the virtual area based client application 20 running on the client network node 12. In this way, the gateway client can be configured for virtual area based communications by the area service instance running on the area server 172.

The spawned VOIP gateway service sends to the ITSP 192 a Session Initiation Protocol (SIP) Invite message requesting a session with the PSTN terminal device 186 (FIG. 6B, block 208). The ITSP 192 completes the SIP Invite by sending a SIP Ack to the VOIP gateway service.

After the SIP Invite has been completed, a RealTime Protocol (RTP) session is established between the VOIP gateway service and the ITSP 192 (FIG. 6B, block 210). The ITSP 192 also establishes a PSTN connection with the PSTN terminal device 186. Audio data is transmitted between the ITSP 192, the VOIP gateway service, and the gateway client instance over the RTP session (FIG. 6B, block 212). The audio data is transmitted between the gateway client instance and the client network node 12 (FIG. 6B, block 214).

In some examples, the VOIP gateway server 176 includes a translation engine (e.g., a DTMF character decoder, a VXML interpreter, or a speech recognition engine) that translates signals received from the ITSP 192 into commands for interacting in the virtual area. In some examples, the translation engine translates DTMF characters into commands for navigating the PSTN terminal device user to different zones of the virtual area, interacting with objects in the virtual area, or controlling one or more of the PSTN terminal device user's speaker and microphone channels.

In some examples, the VOIP gateway server 176 includes a translation engine for converting DTMF characters or VXML data received from the ITSP 192 into chat text and for converting chat text into speech or VMXL. A Short Message Service (SMS) bridge or gateway server exchanges the chat text related data with the ITSP 192. In this way, the user of the PSTN terminal device 186 is able to participate in a text chat conversation with another communicant in the virtual area or access text chat messages that are stored in association with the virtual area.

In some examples, the gateway client instance and the client network node 12 establish a peer-to-peer communication session in accordance with the STRAW stream transport protocol described in U.S. patent application Ser. No. 12/825,512, filed Jun. 29, 2010, which defines channels for transmitting media records and Sococo Definition Architecture (SODA) records each containing one or more SODA definitions (e.g., maintenance definitions, client provisioning definitions, definitions of 3D rendering assets, and definitions of Realtime Differential Streams (RDS), such as avatar motion checkpoints). In this way, the area service can configure the gateway clients and the communications applications executing on the client network nodes for virtual area based communications in essentially the same way.

Figure 7:
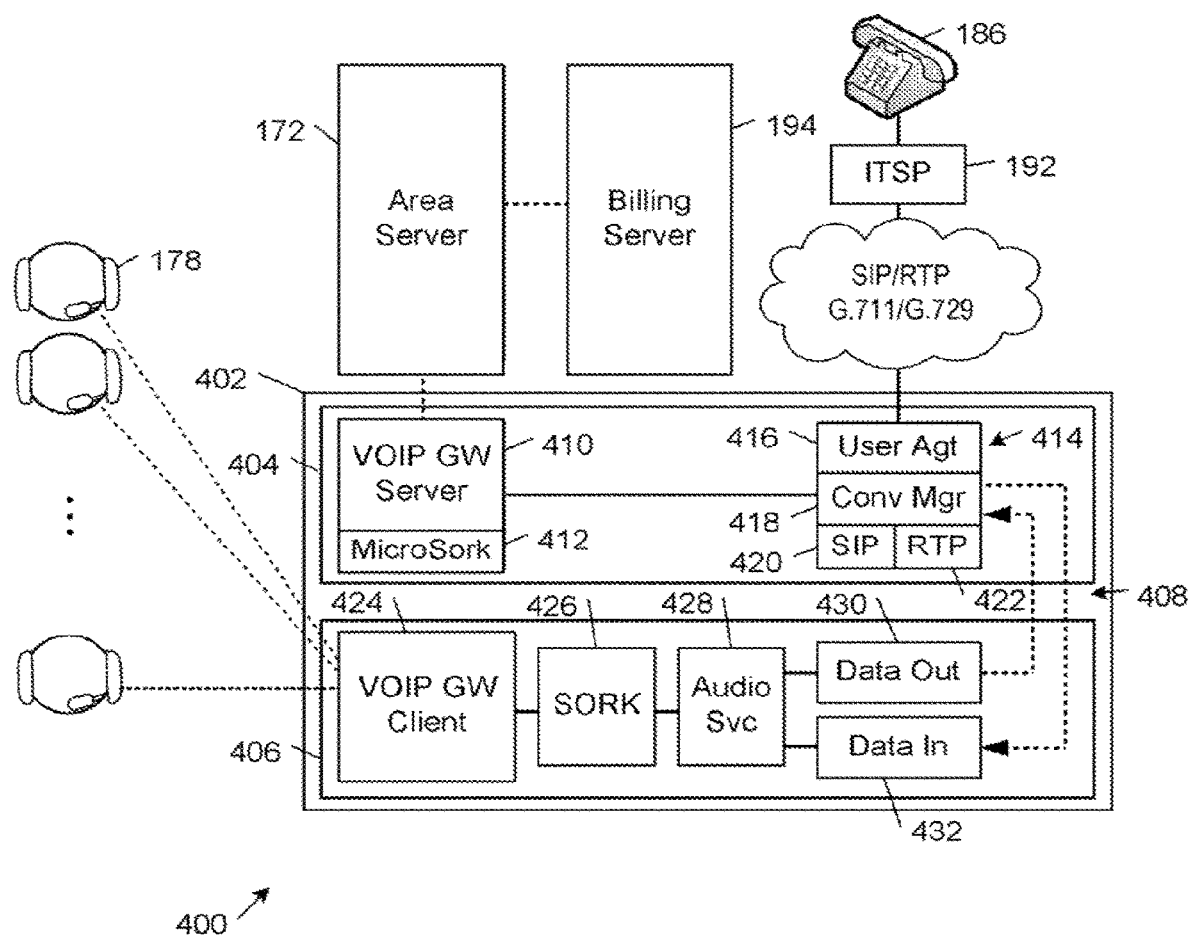
FIG. 7 is a block diagram of an example of the network communications environment of FIG. 6A.

FIG. 7 shows an example 400 of the network communications environment 170 (see FIG. 6A) that includes an example 402 of the VOIP gateway server 170. The VOIP gateway server 402 includes a VOIP gateway server process 404 for communicating with the area server 172, a respective VOIP gateway client process 406 for each of the client network nodes in a virtual area, and an interprocess pipe 408 through which the gateway server process 404 communicates with the gateway client processes 406.

The gateway server process 404 includes a VOIP gateway service 410 that includes a MicroSork kernel 412, which corresponds to a stripped version of the SORK kernel described in U.S. application Ser. No. 12/630,973, filed on Dec. 4, 2009, that includes the message handling functions but omits the audio mixing functions. The gateway server process 404 also includes a telephony service 414 that includes a user agent 416 for communicating with the ITSP 192, a conversation manager 418 for communicating with the VOIP gateway client process 406 over the interprocess pipe 408, and SIP and RTP libraries 420, 422 (e.g., reSIProcate libraries) for building SIP and RTP communication stacks.

Each VOIP gateway client process 406 includes a VOIP gateway client service 424, a SORK kernel 426, and an audio service manager 428, an outgoing interprocess pipe data handler 430 (e.g., a reSIProcate producer), and an ingoing interprocess pipe data handler 432 (e.g., a reSIProcate consumer). Examples of the SORK kernel 426 and the audio service manager 428 are described in in U.S. application Ser. No. 12/630,973, filed on Dec. 4, 2009.

Figure 8A:
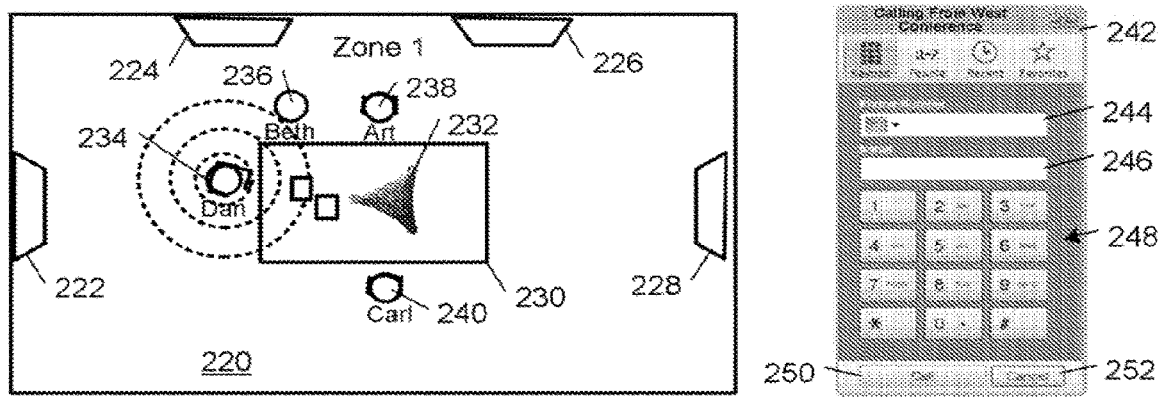
FIG. 8A is a diagrammatic view of a virtual area and an associated graphical interface for initiating a virtual area based telephony communication.
Figure 8B:
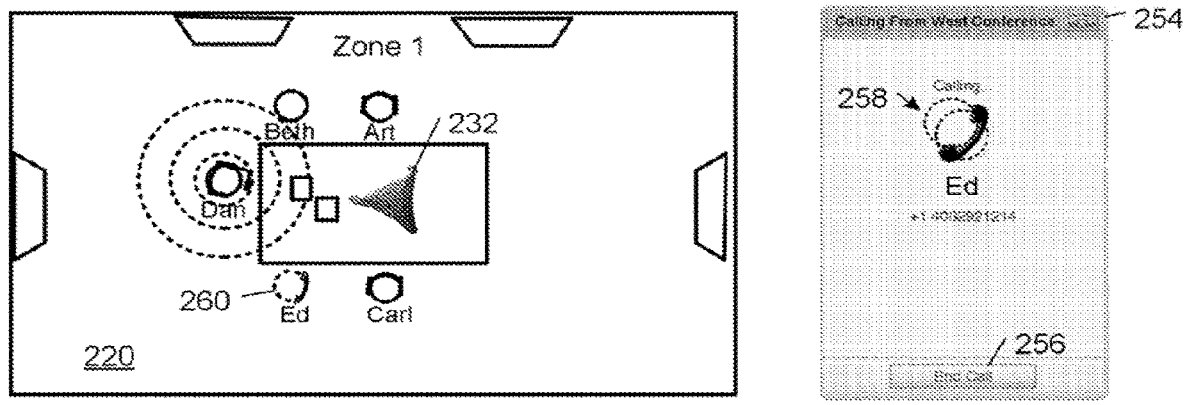
FIG. 8B is a diagrammatic view of a virtual area and an associated graphical interface for managing a virtual area based telephony communication.
Figure 8C:
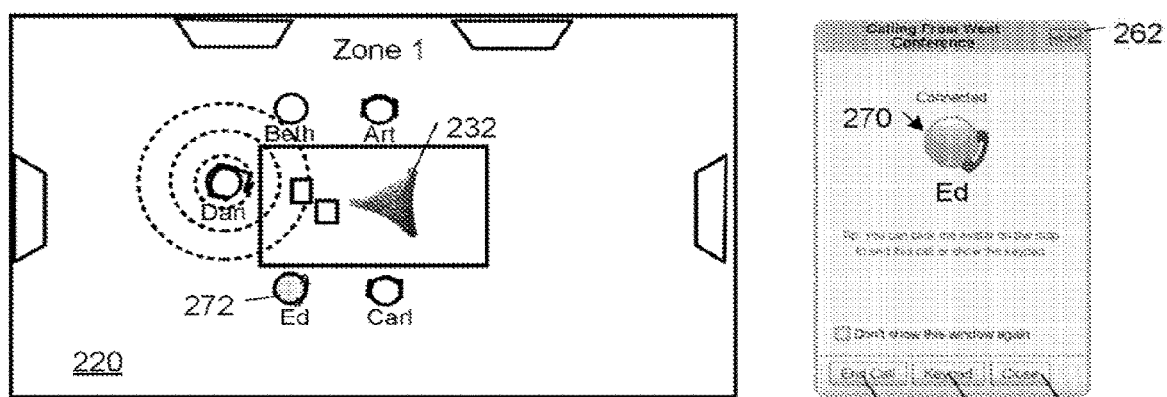
FIG. 8C is a diagrammatic view of a virtual area and an associated graphical interface for managing a virtual area based telephony communication.

FIGS. 8A-8C show an exemplary spatial visualization of a zone 220 (Zone 1) of a virtual area and respective graphical user interfaces for managing calls to PSTN terminal devices. The virtual area zone 220 contains four viewscreen objects 222, 224, 226, 228, a table object 230, and a conferencing object 232. The virtual area zone 220 also contains four sprites 234, 236, 238, and 240 representing respective communicants (Dan, Beth, Art, and Carl) who are present in the virtual area zone 220. As explained below, any of the communicants in the virtual area zone 220 can bring (or "get") a PSTN terminal device user into a communication session in the virtual area zone 220 simply by calling the user's PSTN terminal device via the conferencing object 232.

Referring to FIG. 8A, in response to activation of the conferencing object 232 by a respective one of the communicants, the area service instance administering the virtual area zone 220 transmits a specification of a dialer interface 242 to the communicant's client network node, which renders a graphic representation of the dialer interface 242 on the communicant's display. The dialer interface 242 includes a Phone Number input box 244 for entering the telephone number of the target PSTN terminal device, a Name input box 246 for entering or displaying the name of the target user of the target PSTN terminal device, a keypad 248 for entering the telephone number in the Phone Number input box 244, a Call button 250 for submitting the telephone number displayed in the Phone Number input box 244 to the area service, and a Cancel button 252 for closing the dialer interface 242.

Referring to FIG. 8B, upon receipt of the telephone number of the target PSTN terminal device from the client network node, the area service administers the establishment of a virtual area based telephony session with the target PSTN terminal device. While the virtual area based telephone session is being established, the area service instance administering the virtual area zone 220 transmits a specification of a call-in-progress interface 254 to the communicant's client network node, which renders a graphic representation of the call-in-progress interface on the communicant's display. The call-in-progress interface 254 includes an End Call button 256 that allows the user to terminate the call establishment process. The call-in-progress interface 254 also includes a graphic representation 258 of the callee that indicates that a call is being established. In the illustrated example, the graphic representation consists of dashed lines that depict the callee in multiple positions, where the dashed lines suggest that the callee is not yet present in the virtual area zone and the multiple depicted positions corresponds to a spatial representation of a "ringing" sound that typically is used in telephony calls to indicate that the call has gone through but has not yet been answered. A similar graphical representation 260 of the callee is shown in the virtual area zone 220.

Referring to FIG. 8C, after the call with the target PSTN terminal device has been established, the area service instance administering the virtual area zone 220 transmits a specification of a call-connected interface 262 to the communicant's client network node, which renders a graphic representation of the call-connected interface 262 on the communicant's display. The call-connected interface 262 includes an End Call button 264 that allows the user to terminate the call, a Keypad button for displaying the dialer interface 242, and a close button 268 for closing the call-connected interface 262. The call-connected interface 262 also includes a graphic representation 270 of the callee that indicates that a call is connected. In the illustrated example, the graphic representation 270 of the callee shows a complete depiction of a sprite that corresponds to the graphic representations of the other communicants in the room, except that the callee's sprite includes a graphic representation of a telephone indicating that the callee is connected to the virtual area zone 220 via a PSTN terminal device. A similar graphical representation 272 of the callee is shown in the virtual area zone 220.

In the example described above, any of the communicants in the virtual area zone 220 is able to bring a PSTN terminal device user into the virtual area zone 220 by entering a telephone for the callee and clicking on the Call button 250 in the dialer interface 242.

Figure 9A:
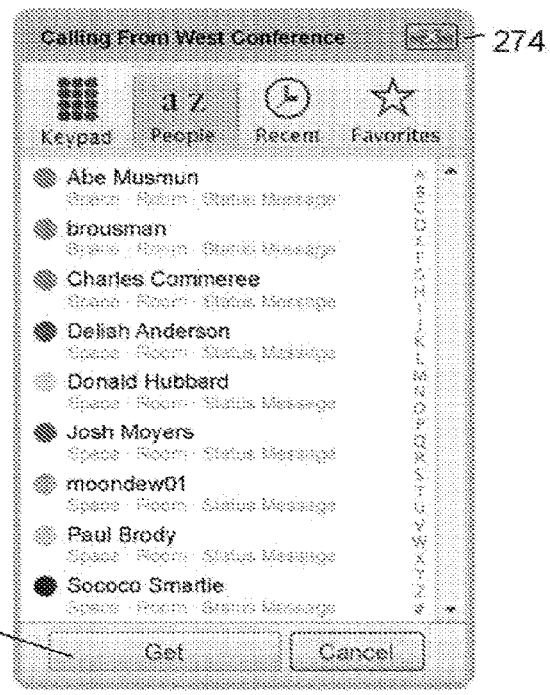
FIGS. 9A-9C are diagrammatic views of graphical interfaces for getting a PSTN terminal device user into a virtual area.
Figure 9B:
Figure 9C:
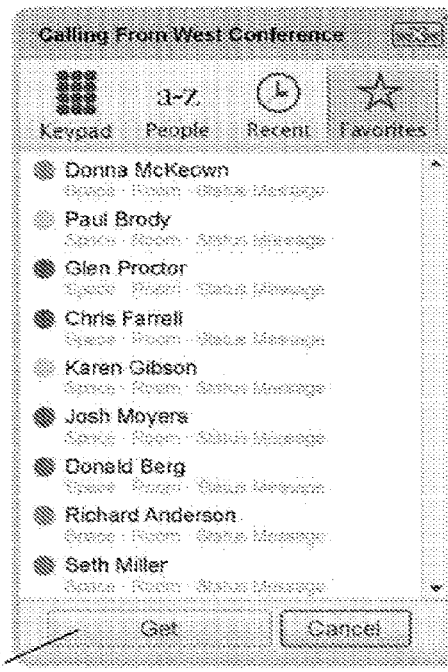

FIGS. 9A-9C show alternative graphical interfaces for bringing a PSTN terminal device user into a virtual area or a particular zone of a virtual area. Like the dialer interface 242, each of these graphical interfaces includes a respective Get button 275, 277, 279 that enables a user to get a target callee into a virtual area with one click. FIG. 9A shows a People interface 274 that displays an alphabetically ordered list of all of the user's contacts and members of the current virtual area or zone in which the user is present who are callable (i.e., has a known telephone number). FIG. 9B shows a Recent Calls interface 276 that displays a list of all of the callees that the user has called in order from most recently called to least recently called. FIG. 9C shows a Favorites interface 278 that displays a list of callees that the user has designated as a Favorite ordered by call frequency from most frequently called to least frequently called. Each of the interfaces 274-278 enables the user to scroll through the displayed list of callees, select a target callee, and click the Get button to bring the target callee into the virtual area from which the user is calling (e.g., West Conference). In some examples, the user is able to select multiple target callees from the displayed list and bring all of the target callees into the current virtual area or zone with a single click of the Get button.

Figure 10A:
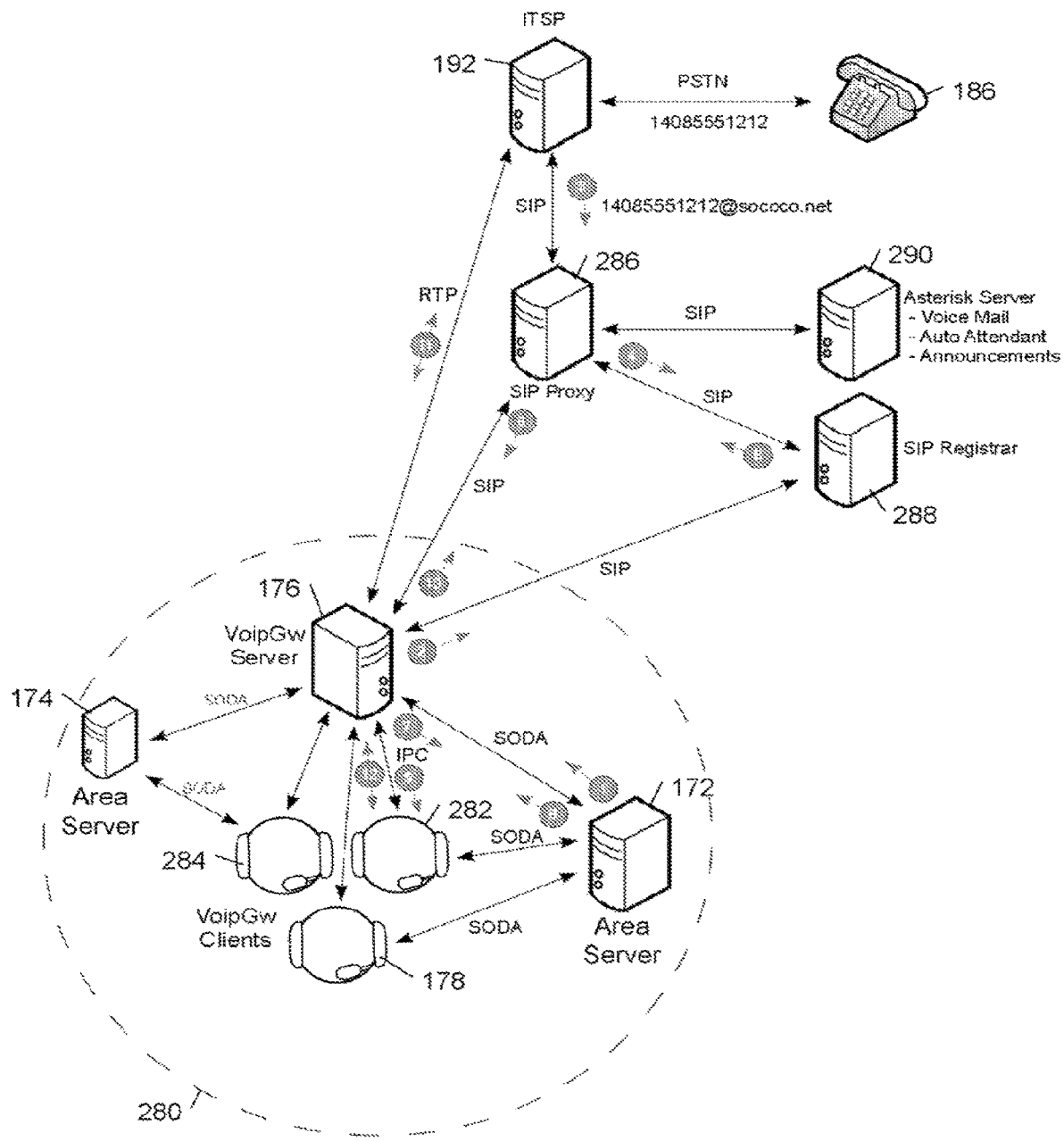
FIG. 10A is a block diagram of an example of a network communications environment that supports virtual area based telephony communications.

FIG. 10A shows an example 280 of the network communications environment 10 that supports virtual area based telephony communications in which a user of a PSTN terminal device can establish a presence in or interact with data associated with a virtual area or a particular zone of a virtual area by calling a dial-in telephone number that is associated with the virtual area or zone.

The network communications environment 280 includes first and second area servers 172, 174, a VOIP gateway server 176, a SIP proxy server 286, a SIP registrar server 288, and an optional asterisk server 290. Each of the first and second area servers 172, 174 executes a respective instance of the area service that administers a respective virtual area in which communicants can interact with each other and with data stored in association with the virtual areas. In the illustrated example, the first area server 172 creates a first virtual area in which client network node users (represented by sprites 178, 282) are present. The second area server 174 creates a second virtual area in which a third client network node user (represented by sprite 284) is present. The VOIP gateway server 76 communicates with a user's PSTN terminal device 186 through an Internet Telephony Service Provider (ITSP) 192, which communicates with the PSTN terminal devices over the PSTN. The SIP proxy server 286 communicates with the VOIP gateway server 176, the ITSP 192, the SIP registrar server 288, and the asterisk server 290. The asterisk server 290 provides additional services to the PSTN terminal device users, including voice mail services, auto attendant services, and announcement services.

Figure 10B:
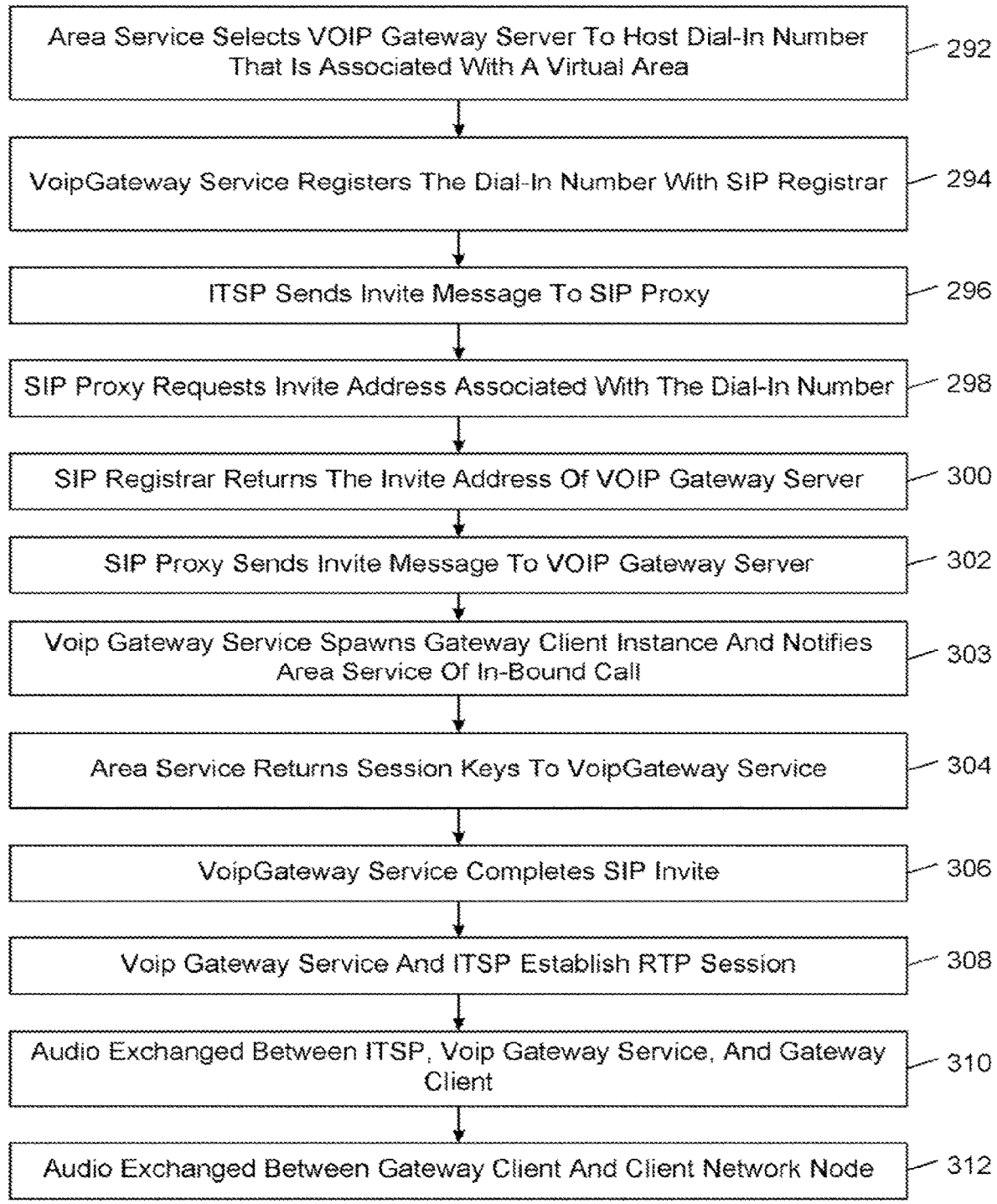
FIG. 10B is a flow diagram of an example virtual area based telephony method.

FIG. 10B shows an example virtual area based telephony method in which a user of a PSTN terminal device (e.g., PSTN device 186) initiates a virtual area based telephony communication with a virtual area or a particular zone of a virtual area by dialing the dial-in telephone number that is associated with the virtual area or zone.

In accordance with the method of FIG. 10B, each of the area services running on the area servers 174, 176 select a respective VOIP gateway server to host a respective dial-in telephone number that is associated with a respective virtual area or zone (FIG. 10B, block 292). In the illustrated example, the area service running on the area server 172 selects the VOIP gateway server 176 to host a first dial-in number that is associated with the virtual area or zone in which the client network node users 178, 282 are present; and the area service running on the area server 174 also selects the VOIP gateway server 176 to host a second dial-in telephone number that is associated with the virtual area or zone in which the client network node user 282 is present.

The VOIP gateway server 176 registers each of the dial-in telephone numbers with the SIP proxy registrar server 288 (FIG. 10B, block 294).

In response to receipt of a call from the PSTN terminal device 186 to a respective one of the dial-in telephone numbers, the ITSP 192 sends a SIP Invite message to the SIP proxy server 286 (FIG. 10B, block 296). The SIP proxy server 286 requests the network address (e.g., a URI, such as a URL) of the VOIP gateway server that is associated with the dial-in telephone number from the SIP registrar server 288 (FIG. 10B, block 298). The SIP registrar server 288 returns the network address of the VOIP gateway server to the SIP proxy server 286 (FIG. 10B, block 300).

The SIP proxy server 286 sends the SIP Invite message to the VOIP gateway server 176. In response, the VOIP gateway server 176 spawns an instance of a gateway client for the PSTN terminal device 186 and sends a notification of the in-bound telephone call to the area service hosting the virtual area or zone associated with the dial-in telephone number (FIG. 10B, block 303). The area services sends the session keys (also referred to as "credentials") for the virtual area or zone to the VOIP gateway server 176 (FIG. 10B, block 304).

The VOIP gateway service completes the SIP Invite by sending a SIP Ack to the ITSP 192 (FIG. 10B, block 304). The VOIP gateway service and the ITSP 192 establish a RTP session (FIG. 10B, block 308). Audio data is transmitted between the ITSP 192, the VOIP gateway service, and the gateway client instance over the RTP session (FIG. 10B, block 310). The audio data is transmitted between the gateway client instance and the client network nodes (FIG. 10B, block 312).

In some examples, the virtual environment creator 18 establishes a presence for a PSTN terminal device user in a virtual area or a particular zone of the virtual area in response to receipt of a telephone number that is associated with the virtual area or a particular zone of the virtual area. If the virtual area or zone currently is occupied by one or more communicants, the virtual area creator 18 establishes a presence for the PSTN terminal device user in the virtual area or zone and administers the connections of the sources and sinks of the communicants and the PSTN terminal device user through the VOIP gateway server 176. If the virtual area is unoccupied (i.e., there is no one present), the virtual environment creator 18 instantiates a respective instance of the area service to administer the virtual area and establish a presence for the PSTN terminal device user in the virtual area or zone. In this case, the PSTN terminal device user may interact with data that is stored in association with the virtual area or zone, or may submit one or more commands (e.g., DTMF control characters) for the area service to request one or more communicants to join the PSTN terminal device user in the virtual area or zone.

Figure 11A:
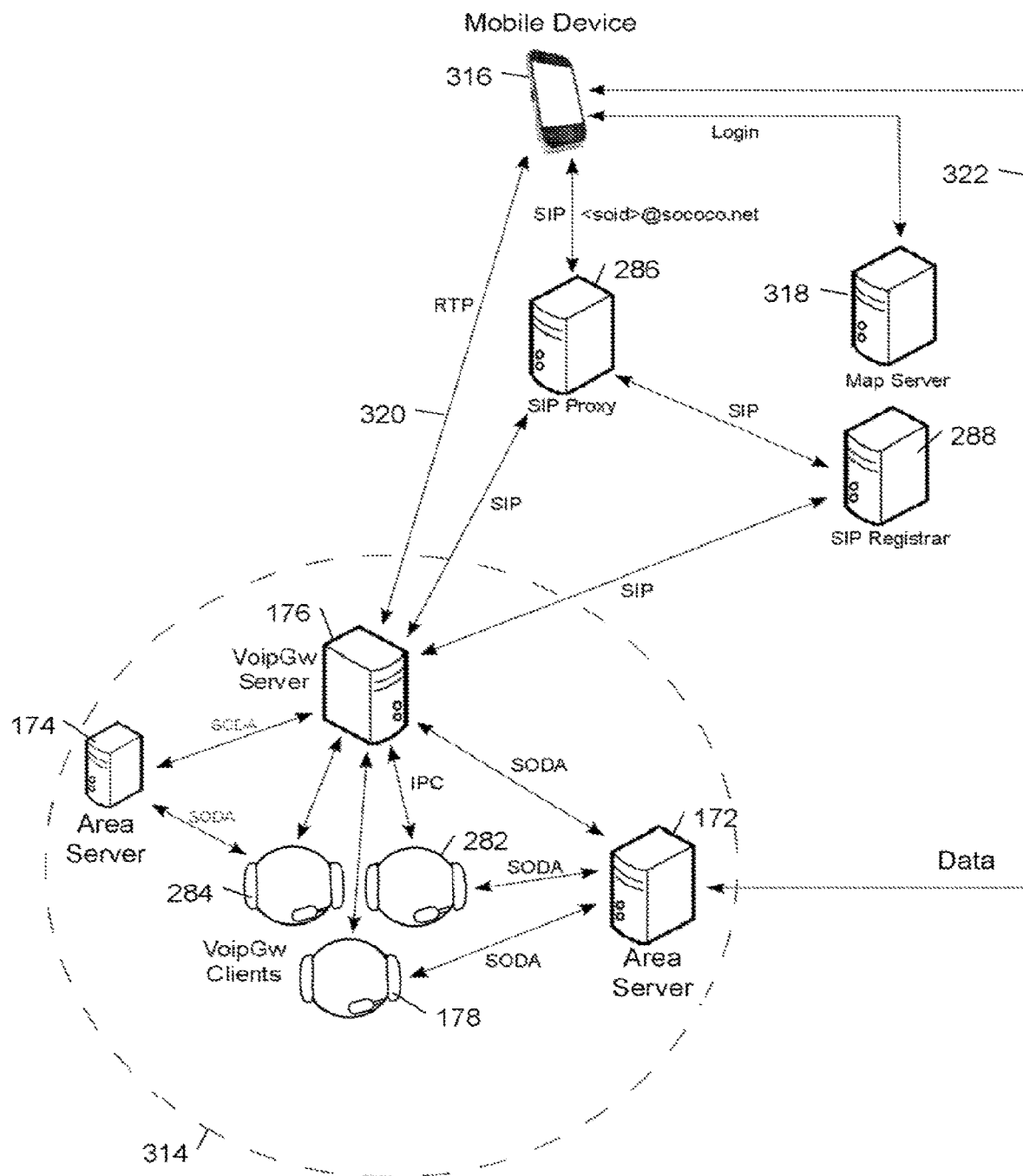
FIG. 11A is a block diagram of an example of a network communications environment that supports virtual area based telephony communications.

FIG. 11A shows an example 314 of the network communications environment 10 that supports virtual area based telephony communications in which a user of a mobile device 316 (e.g., a mobile phone and a portable computing device, such as a tablet computer or a notebook computer) connects to a virtual area using a mobile client communications application.

The network communications environment 280 includes first and second area servers 172, 174, a VOIP gateway server 176, a SIP proxy server 286, a SIP registrar server 288, and an optional map server 318. Each of the first and second area servers 172, 174 executes a respective instance of the area service that administers a respective virtual area in which communicants can interact with each other and with data stored in association with the virtual areas. In the illustrated example, the first area server 172 creates a first virtual area in which client network node users (represented by sprites 178, 282) are present. The second area server 174 creates a second virtual area in which a third client network node user (represented by sprite 284) is present. The VOIP gateway server 76 communicates with the mobile device 316 and the SIP proxy server 286. The SIP proxy server 286 communicates with the VOIP gateway server 176 and the SIP registrar server 288. The map server 318 provides logon services to the client network nodes and the mobile device 316.

In some examples, the mobile client communications application is a modified version of the virtual area based client applications 20, 22 running on the client network nodes 12, 14. In some of these examples, the mobile client communications application includes a stripped down version of the SORK kernel described in U.S. application Ser. No. 12/630,973, filed on Dec. 4, 2009, that includes the message handling functions but omits the audio mixing functions.

Figure 11B:
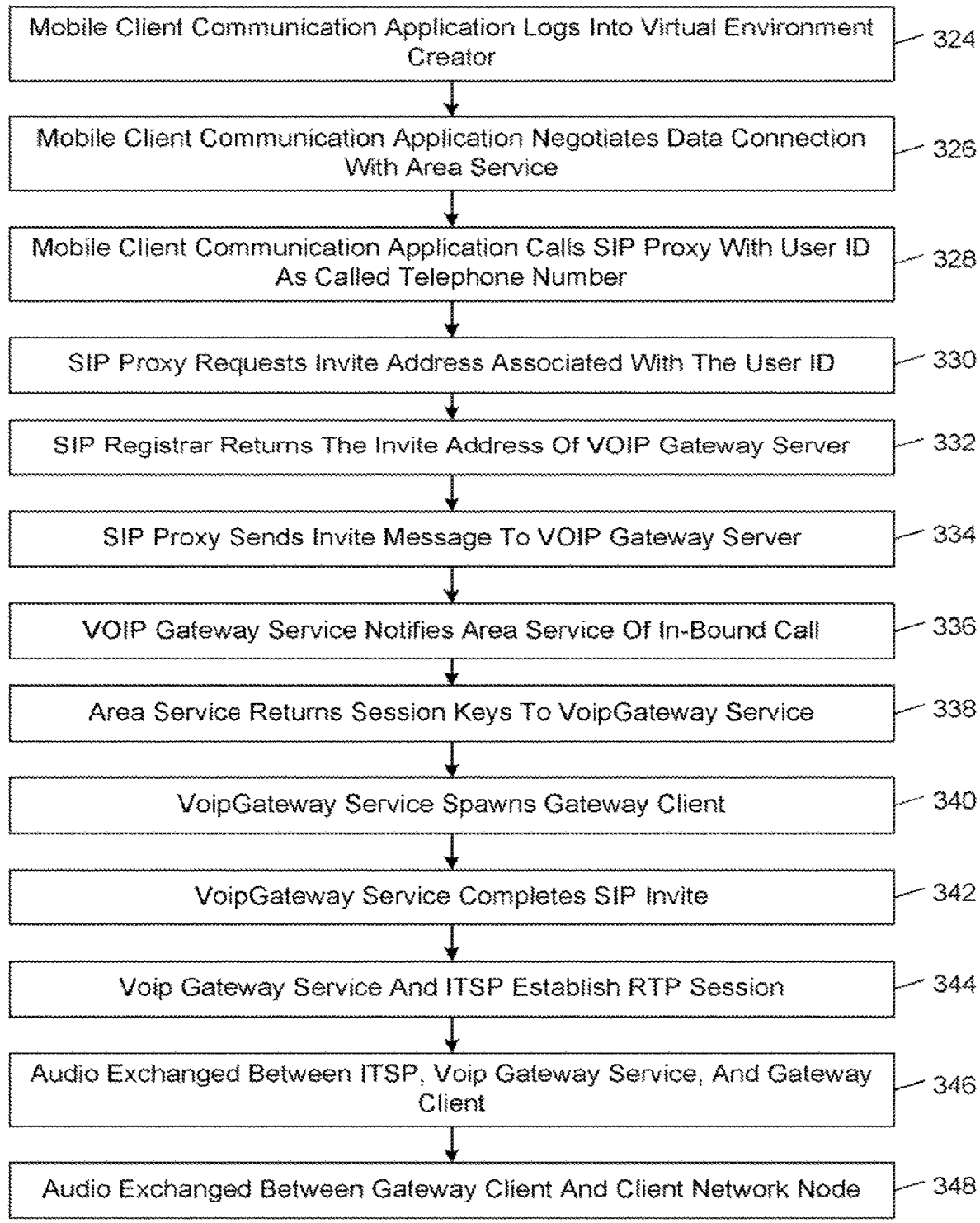
FIG. 11B is a flow diagram of an example virtual area based telephony method.

FIG. 11B is a flow diagram of an example virtual area based telephony method in which a user of a mobile device connects to a virtual area or a particular zone of a virtual area using a mobile client communications application. In this example, the mobile device 316 makes two separate connections: an audio connection 320 to the VOIP gateway server 176; and a data connection 322 to the area server 172.

In accordance with the method of FIG. 11B, the mobile client communications application logs into the virtual environment creator 18 (FIG. 11B, block 324). In the illustrated example, the mobile client communications application logs in through the map server 318, which selects an area server to administer the virtual area to which the mobile client communications application was requested to connect. The map server 318 sends the network address of the selected area server to the mobile client communications application.

The mobile client communications application negotiates a data connection 322 with the area service running on the selected area server (FIG. 11B, block 326). In some examples, the data is sent as SODA definitions in accordance with the STRAW stream transport protocol described in U.S. patent application Ser. No. 12/825,512, filed Jun. 29, 2010.

The mobile client communications application calls the SIP proxy server 286 with the user's user ID as the called telephone number (FIG. 11B, block 328). The SIP proxy server 286 requests the network address (e.g., a URI, such as a URL) of the VOIP gateway server associated with the user ID from the SIP registrar server 288 (FIG. 11B, block 330). The SIP registrar server 288 returns the network address of the VOIP gateway server to the SIP proxy server 286 (FIG. 10B, block 332).

The SIP proxy server 286 sends the SIP Invite message to the VOIP gateway server 176 (FIG. 11B, block 334). In response, the VOIP gateway server 176 sends a notification of the in-bound telephone call to the area service hosting the virtual area associated with the user ID (FIG. 11B, block 336). The area services sends the session keys (also referred to as "credentials") for the virtual area to the VOIP gateway server 176 (FIG. 11B, block 338).

The VOIP gateway service completes the SIP Invite by sending a SIP Ack to the ITSP 192 (FIG. 11B, block 342). The VOIP gateway service and the ITSP 192 establish a RTP session on the RTP connection 320 (FIG. 11B, block 344). Audio data is transmitted between the ITSP 192, the VOIP gateway service, and the gateway client instance over the RTP connection 320 (FIG. 11B, block 346). The audio data is transmitted between the gateway client instance and the client network nodes (FIG. 11B, block 348). In this process, the gateway client instance mixes the realtime audio streams received from the other communicants in the virtual area to produce a single mixed audio stream that is transmitted to the mobile device 316.

In this example, the mobile client communications application renders a graphical user interface of the type shown in FIGS. 2-4 on a display of the mobile device 316. In this process, the mobile client application receives from the area service a specification of the virtual area, the positions of the objects in the virtual area, and realtime differential stream (RDS) data describing the states of the communicants' communication channels. Based on this data, the mobile client communications application renders on the display graphical representation of the communicants in spatial relation to a graphic representation of the virtual area, and visual cues indicating the states of the communicants' communications channels synchronized with the audio data received over the audio connection 320.

III. CONCLUSION

Other embodiments are within the scope of the claims.

The invention claimed is:
1. A system comprising:
one or more processors included in a computer; system; and
a memory, coupled to the one or more processors, storing code that when executed by the one or more processors causes the computer system to perform operations comprising:
connecting to a network communications environment supporting realtime communications between client communicants in virtual areas;
managing a realtime communication session between the client communicants operating respective client network nodes each of which executes a respective realtime communications application that administers the realtime communication session through integration of functionality for (i) exchanging peer-to-peer realtime data streams in association with functionality and for (ii) rendering a spatial visualization comprising a respective visual representation of each of the client communicants in a visual area, wherein the managing comprises establishing respective presences for the client communicants in the visual area, determining respective locations of the visual representations of the client communicants in the visual area, and managing realtime communications between the client communicants based on the determined locations of their respective visual representations in the visual area;

through a web browser application, interfacing a guest communicant operating the web browser application on a guest network node with the realtime communication session, wherein the interfacing comprises establishing a presence for the guest communicant in a respective location in the visual area, transmitting to the guest network node an interface specification comprising specifications of the visual representation of the virtual area and the visual representations of the guest communicant and the client communicants and their respective current locations in the visual area, and responding to messages received from the web browser application in connection with respective elements of the interface specification;

wherein the interface specification transmitted to the guest network node comprises specifications for depicting cues indicating respective current communication states of communication channels respectively allocated for carrying realtime data streams communicated by the network nodes of the client communicants in the visual area independent of any communications received by the guest network node on the communication channels, and the visual representations change dynamically to reflect current realtime data stream activities on the respective communication channels over which respective ones of the client network nodes are configured to communicate.

2. The system of claim 1, wherein the interfacing comprises sending to the guest network node a rendering engine that is executable by the web browser and is operable to translate the interface specification into a format that is interpretable by the web browser application.

3. The system of claim 1, wherein the transmitting comprises transmitting the interface specification to the web browser application in an extended markup language (XML) format, and the rendering engine is operable to translate the interface specification from the XML format to a hyper text markup language (HTML) interface specification and to render the HTML specification in a web browser frame.

4. The system of claim 1, wherein the interface specification comprises respective specifications of one or more zones of the visual area, each of the zones is addressed by a different respective universal resource locator (URL), and the responding comprises responding to a particular message from the web browser application referencing a respective one of the URLs based on properties of the zone that is addressed by the respective URL referenced by the particular message.

5. The system of claim 1, wherein when the code is executed by the one or more processors, the executed code causes the computer to further perform operations comprising:

in response to a message from a given one of the client communicants to activate an audio sink communication channel, incorporating in the interface specification a specification for depicting the visual representation of the given communicant with a visual indication that the given communicant is configured as an audio sink.

6. The system of claim 1, wherein when the code is executed by the one or more processors, the executed code causes the computer to further perform operations comprising:

in response to a message from a given one of the client communicants to activate an audio source communication channel, incorporating in the interface specification a specification for depicting the visual representation of the given client communicant in the visual area with a visual indication that the given communicant is configured as an audio source.

7. The system of claim 1, wherein when the code is executed by the one or more processors, the executed code causes the computer to further perform operations comprising:

receiving from the web browser application a particular message to change the state of a guest audio communication channel over which the guest communicant is registered to communicate; and in response to the particular message, transmitting to each of the client network nodes a respective specification for depicting a visual representation of the guest communicant in the visual area with a visual indication of the changed state of the guest audio communication channel.

8. The system of claim 1, wherein when the code is executed by the one or more processors, the executed code causes the computer to further perform operations comprising:

receiving from the web browser application a particular message to move the visual representation of the guest communicant from a current location in the visual area to a new current location in the visual area;

determining the new current location of the visual representation of the guest communicant in the visual area based on the particular message; and sending updates to the browser application, wherein the updates comprise modifications to the interface specification that reflect the visual representation of the guest communicant moved to the new current location.

9. The system of claim 1, wherein when the code is executed by the one or more processors, the executed code causes the computer to further perform operations comprising:

transmitting to each of the client network nodes a respective specification of the visual representation of the guest communicant and its respective current location in the visual area in association with a unique guest identifier of the guest communicant, wherein the guest identifier is associated with a realtime communication channel established between the guest network node and one or more of the client network nodes.

10. The system of claim 1, wherein the interface specification comprises one or more props, each of the props represents a respective communication channel for communications between the client and guest network nodes, each of the props is addressable by a different respective universal resource locator (URL), and in response to receipt of a particular message from the web browser application referencing a respective one of the URLs, the responding comprises responding to the particular message based on properties of the prop that is addressable by the respective URL referenced by the particular message.

11. The system of claim 1, wherein when the code is executed by the one or more processors, the executed code causes the computer to further perform operations comprising:

in response to receiving from the web browser application a particular message corresponding to a selection of a viewscreen prop in the visual area, administering an application sharing session between the guest network node and each of the client network nodes present in the visual area, wherein the administering comprises capturing a video stream of the application sharing session and supplying the video stream to the given network node for rendering by the web browser application.

12. The system of claim 1, wherein when the code is executed by the one or more processors, the executed code causes the computer to further perform operations comprising:

in response to receiving from the web browser application a particular message corresponding to a selection of a table prop in the visual area, initiating a file sharing session between the guest network node and each of the client network nodes present in the visual area.

13. The system of claim 1, wherein when the code is executed by the one or more processors, the executed code causes the computer to further perform operations comprising:

registering the guest communicant with a unique guest identifier that is associated with a realtime communication channel between the guest network node and one or more of the client network nodes, wherein the managing comprises transmitting to each of the client network nodes a respective specification of a visual representation of the guest communicant and its respective current location in the visual area in association with the guest identifier.

14. The system of claim 1, wherein the interface specification comprises a specification of a presentation of navigation controls that enable the guest communicant to specify where to establish a presence in the visual area.

15. The system of claim 1, wherein the interface specification comprises a specification of a presentation of interaction controls that enable the guest communicant to manage interactions with one or more of the client communicants in the network communication environment.

16. The system of claim 1, wherein the interface specification comprises a specification of a presentation of a log of event descriptions describing respective events involving interactions of the communicants in the visual area.

17. The system of claim 1, wherein messages are received from the web browser application and responses are sent to the web browser application in accordance with the hypertext transport protocol.

* * * * *